US010879904B1

United States Patent
Gunter et al.

(10) Patent No.: US 10,879,904 B1
(45) Date of Patent: Dec. 29, 2020

(54) APPLICATION SPECIFIC INTEGRATED CIRCUIT ACCELERATORS

(71) Applicant: X Development LLC, Mountain View, CA (US)

(72) Inventors: Michial Allen Gunter, Oakland, CA (US); Charles Henry Leichner, IV, Palo Alto, CA (US); Tammo Spalink, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 16/042,752

(22) Filed: Jul. 23, 2018

Related U.S. Application Data

(60) Provisional application No. 62/535,612, filed on Jul. 21, 2017.

(51) Int. Cl.
| | |
|---|---|
| H03K 19/177 | (2020.01) |
| H03K 19/17736 | (2020.01) |
| G06N 3/08 | (2006.01) |
| G06N 3/063 | (2006.01) |
| G06N 3/04 | (2006.01) |

(52) U.S. Cl.
CPC ......... H03K 19/17744 (2013.01); G06N 3/04 (2013.01); G06N 3/063 (2013.01); G06N 3/082 (2013.01); H03K 19/1774 (2013.01)

(58) Field of Classification Search
CPC .......... G06N 3/04; G06N 3/063; G06N 3/082; H03K 19/1774; H03K 19/17744
See application file for complete search history.

(56) References Cited

U.S. PATENT DOCUMENTS

| | | | | |
|---|---|---|---|---|
| 5,260,881 A | * | 11/1993 | Agrawal | ............ H03K 19/1737 326/39 |
| 5,455,525 A | * | 10/1995 | Ho | ................... H03K 19/17704 326/39 |
| 5,469,003 A | * | 11/1995 | Kean | ................ H03K 19/17756 326/39 |
| 5,883,525 A | * | 3/1999 | Tavana | ............. H03K 19/17704 326/39 |
| 8,860,460 B1 | * | 10/2014 | Cashman | ......... H03K 19/17764 326/41 |
| 8,924,455 B1 | | 12/2014 | Barman | |
| 9,323,525 B2 | * | 4/2016 | Kim | ....................... G06F 9/3887 |
| 10,175,980 B2 | * | 1/2019 | Temam | ................. G06F 9/3001 |

(Continued)

OTHER PUBLICATIONS

Chen et al. "DaDianNao: A Machine-Learning Supercomputer," Proceedings of the 47th Annual IEEE/ACM International Symposium on MicroArchitecture, IEEE Computer Society, Dec. 2014, 14 pages.

(Continued)

Primary Examiner — Kurtis R Bahr
(74) Attorney, Agent, or Firm — Fish & Richardson P.C.

(57) ABSTRACT

A tile including circuitry for use with machine learning models, the tile including: a first computational array of cells, in which the computational array of cells is a sub-array of a larger second computational array of cells; local memory coupled to the first computational array of cells; and multiple controllable bus lines, in which a first subset of the multiple controllable bus lines include multiple general purpose controllable bus lines couplable to the local memory.

28 Claims, 11 Drawing Sheets

(56) References Cited

U.S. PATENT DOCUMENTS

| | | | |
|---|---|---|---|
| 2009/0128571 A1* | 5/2009 | Smith | G09G 3/3216 |
| | | | 345/519 |
| 2010/0077374 A1 | 3/2010 | Qiu | |
| 2016/0154717 A1 | 6/2016 | Alvarez-Icaza Rivera et al. | |
| 2016/0342893 A1 | 11/2016 | Ross | |
| 2017/0206939 A1* | 7/2017 | Verma | G11C 7/10 |
| 2018/0046900 A1 | 2/2018 | Dally et al. | |
| 2018/0121377 A1* | 5/2018 | Woo | G06N 3/08 |
| 2018/0157465 A1 | 6/2018 | Bittner et al. | |
| 2018/0189231 A1 | 7/2018 | Fleming, Jr. | |
| 2018/0336165 A1 | 11/2018 | Phelps | |
| 2019/0303743 A1* | 10/2019 | Venkataramani | G06F 9/3834 |

OTHER PUBLICATIONS

USPTO Office Action in U.S. Appl. No. 16/042,839, dated Jan. 7, 2019, 16 pages.

USPTO Office Action in U.S. Appl. No. 16/042,839, dated Jan. 25, 2019, 22 pages.

U.S. Appl. No. 16/042,839, filed Jul. 23, 2018, Michial Allen Gunter.

USPTO Office Action in U.S. Appl. No. 16/827,409, dated May 19, 2020, 15 pages.

* cited by examiner

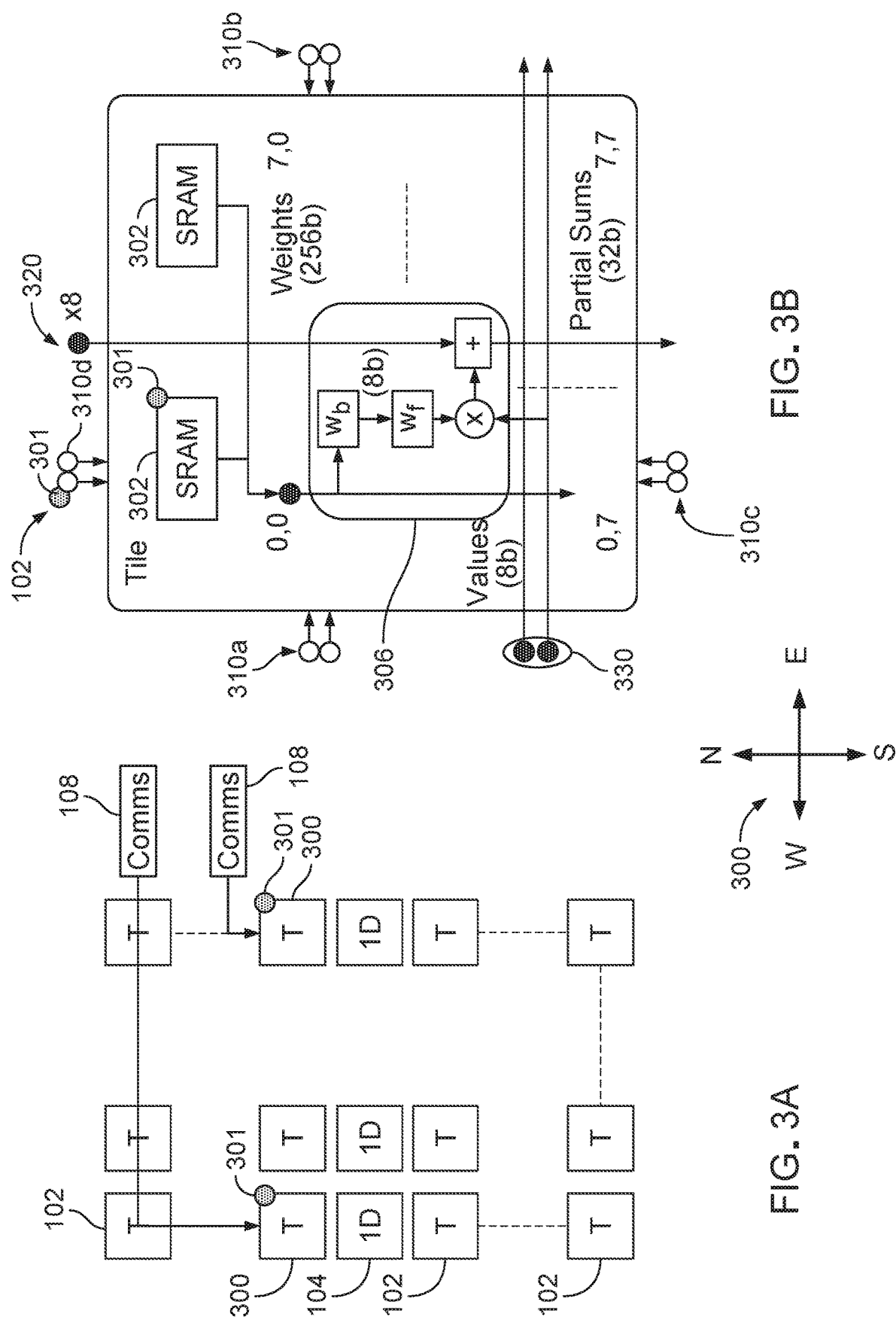

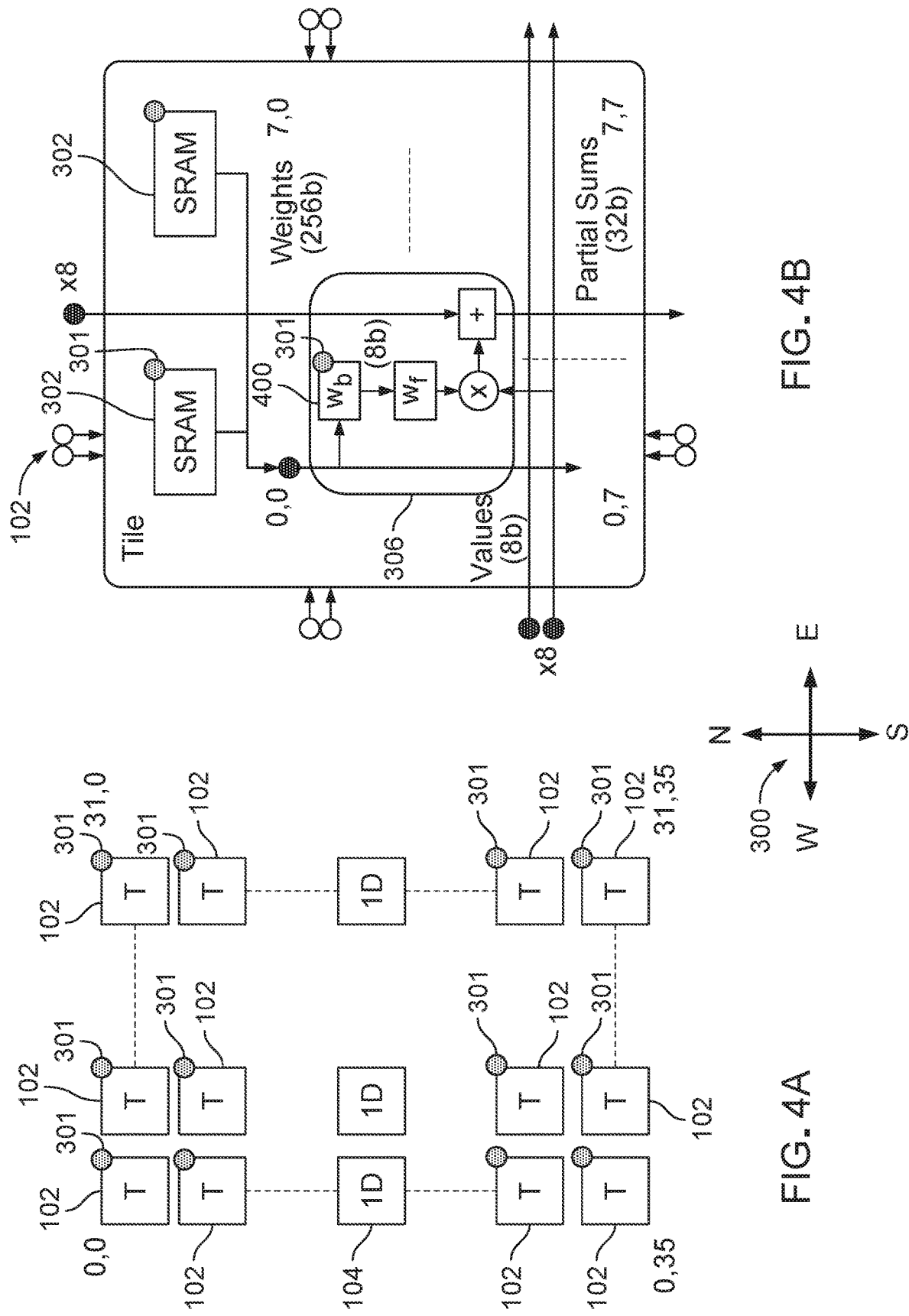

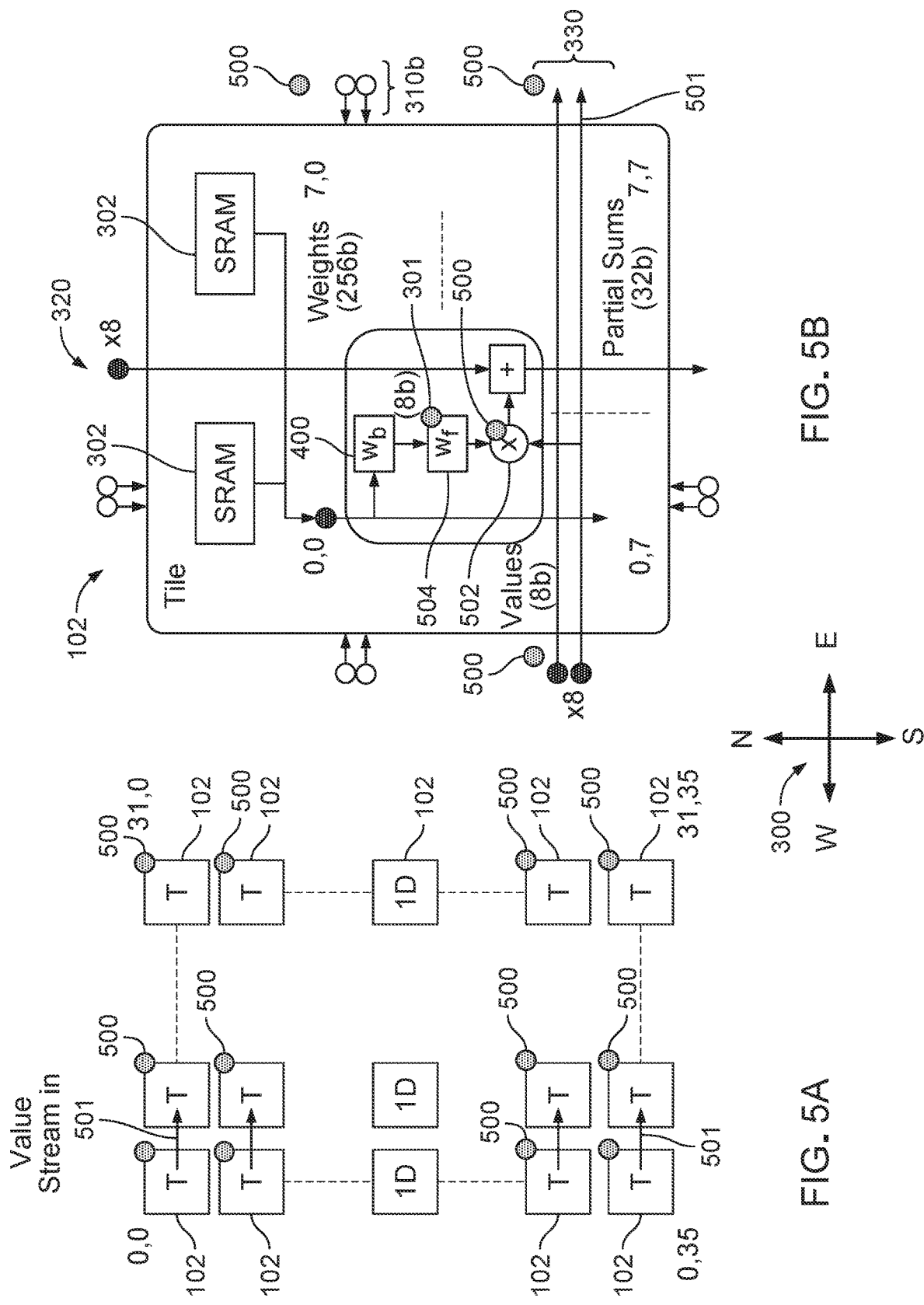

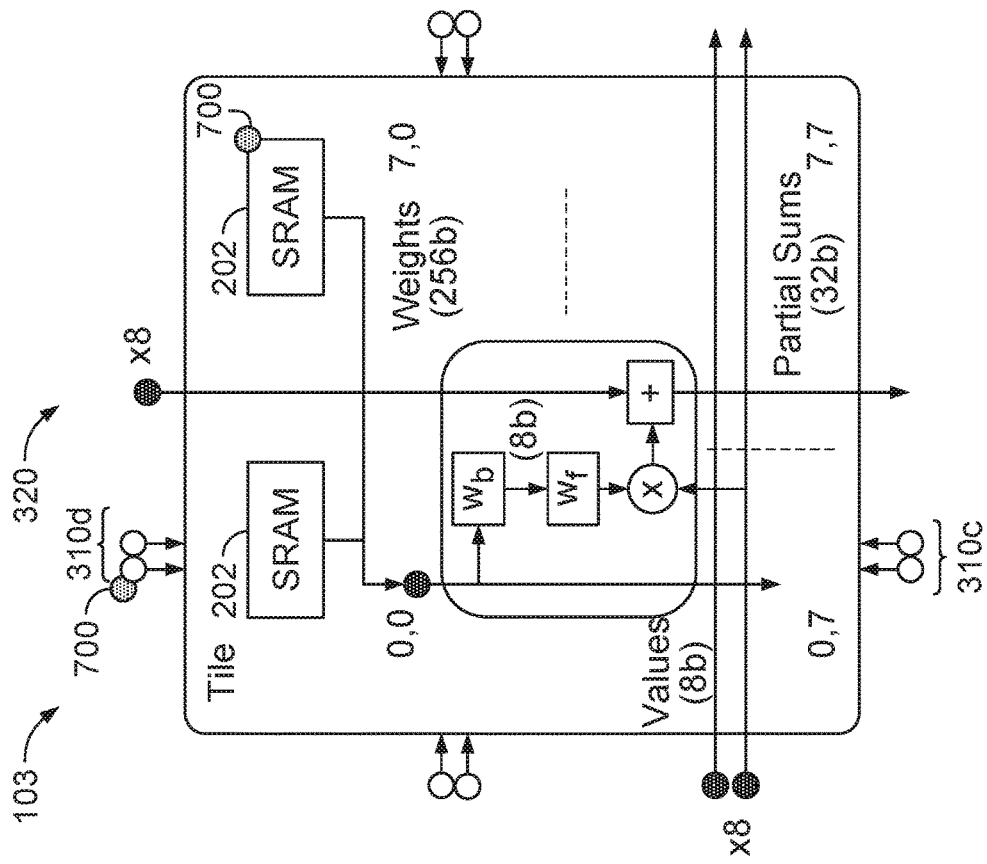
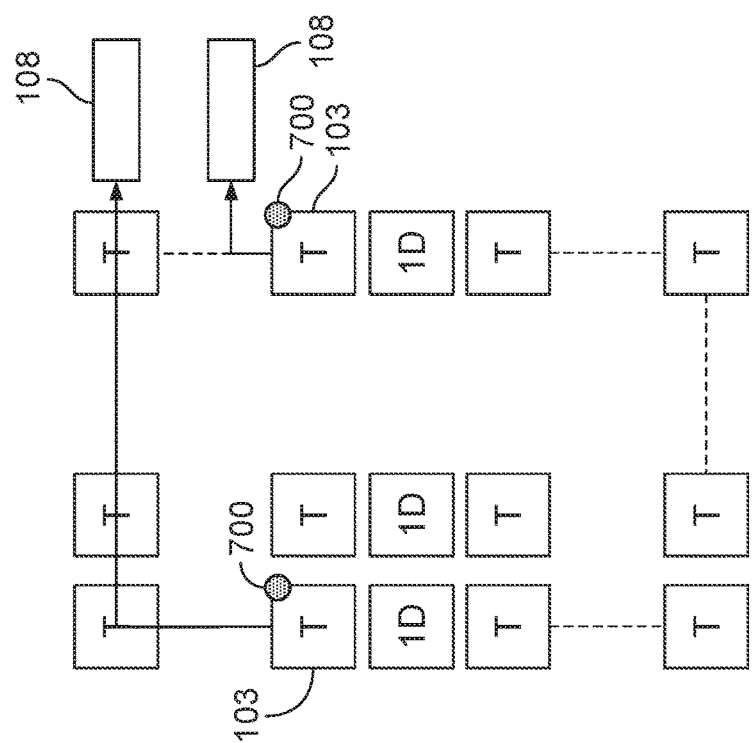
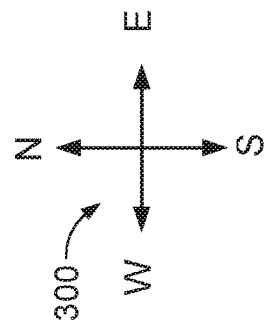
FIG. 9B
FIG. 9A

APPLICATION SPECIFIC INTEGRATED CIRCUIT ACCELERATORS

CROSS-REFERENCE TO RELATED APPLICATION

This application claims the benefit of U.S. Provisional Application No. 62/535,612, filed Jul. 21, 2017, the contents of which are incorporated by reference.

TECHNICAL FIELD

The present disclosure relates to application specific integrated circuit accelerators and methods for operating the same.

BACKGROUND

Neural networks are machine learning models that employ one or more layers of models to generate an output, e.g., a classification, for a received input. Some neural networks include one or more hidden layers in addition to an output layer. The output of each hidden layer is used as input to the next layer in the network, i.e., the next hidden layer or the output layer of the network. Each layer of the network generates an output from a received input in accordance with current values of a respective set of parameters.

Some neural networks include one or more convolutional neural network layers. Each convolutional neural network layer has an associated set of kernels. Kernels can be represented as a matrix structure of weight inputs. Each convolutional layer can also process a set of activation inputs. The set of activation inputs can also be represented as a matrix structure.

Some existing systems perform computations for a given convolutional layer in software. For example, the software can apply each kernel for the layer to the set of activation inputs. That is, for each kernel, the software can overlay the kernel, which can be represented multi-dimensionally, over a first portion of activation inputs, which can be represented multi-dimensionally. The software can then compute a dot product from the overlapped elements. The dot product can correspond to a single activation input, e.g., an activation input element that has an upper-left position in the overlapped multi-dimensional space. For example, using a sliding window, the software then can shift the kernel to overlay a second portion of activation inputs and calculate another dot product corresponding to another activation input. The software can repeatedly perform this process until each activation input has a corresponding dot product. In some implementations, the dot products are input to an activation function, which generates activation values. The activation values can be combined, e.g., pooled, before being sent to a subsequent layer of the neural network.

SUMMARY

In general, in some aspects, the subject matter of the present disclosure encompasses a tile including circuitry for use with machine learning models, in which the tile includes: a first computational array of cells, in which the computational array of cells is a sub-array of a larger second computational array of cells; local memory coupled to the first computational array of cells; multiple controllable bus lines, in which a first subset of the multiple controllable bus lines includes multiple general purpose controllable bus lines couplable to the local memory.

Implementations of the tile may include one or more of the following features. For example, in some implementations, the multiple general purpose controllable bus lines includes: a first group of general purpose controllable bus lines extending along a first dimension of the tile; a second group of general purpose controllable bus lines extending along a second dimension of the tile that is different from the first dimension. The first group of general purpose controllable bus lines may include: at least one general purpose controllable bus line configured to transfer data in a first direction along the first dimension; and at least one general purpose controllable bus line configured to transfer data in a second opposite direction along the first dimension. The second group of general purpose controllable bus lines may include: at least one general purpose controllable bus line configured to transfer data in a first direction along the second dimension; and at least one general purpose controllable bus line configured to transfer data in a second opposite direction along the second dimension.

In some implementations, the tile includes a multiplexer, in which an output of the multiplexer is coupled to the local memory, and in which at least two of the general purpose controllable bus lines are coupled to an input of the multiplexer. The tile may include a register coupled to an input select line of the multiplexer. Each general purpose controllable bus line may include a conveyer element. The conveyer element may include a flip-flop.

In some implementations, a second subset of the multiple controllable bus lines includes multiple partial sum controllable bus lines, in which the partial sum controllable bus lines are couplable to the first array of sub-cells, in which the partial sum controllable bus lines of the multiple partial sum controllable bus lines are coupled to another tile of the larger second computational array of cells, and are configured to receive a partial sum from, or transfer a partial sum to, the other tile of the larger second computational array of cells. Each partial sum controllable bus line of the multiple partial sum controllable bus lines is further coupled to a vector processing unit.

In some implementations, a second subset of the multiple controllable bus lines consists of a single partial sum controllable bus line, the single partial sum controllable bus line is configured to receive a sum obtained by the first array of cells.

In some implementations, the second computational array of cells is a systolic array.

In some implementations, the local memory is configured to receive weight input data, activation input data, and/or instructions from a circuit element external to the tile. The circuit element external to the tile may be a communication interface of an application specific integrated circuit.

In some implementations, the first subset of the multiple controllable bus lines are also coupled to the circuit element external to the tile such that, during operation of the circuit, the weight input data, the activation input data, and/or the instructions are passed along the first subset of controllable bus lines to the local memory.

In some implementations, the first subset of the multiple controllable bus lines is wired directly to a second tile that encompasses an additional sub-array of the second larger array of cells. The first subset of the multiple controllable bus lines skip over a third tile that encompasses yet another sub-array of the second larger array of cells.

In general, in some aspects, the subject matter of the present disclosure encompasses methods of operating an application specific integrated circuit (ASIC) chip including a tile, the tile including (1) a first computational array of cells that is a sub-array of a larger second computational array of cells, (2) local memory coupled to the first computational array of cells, and (3) multiple controllable bus lines, in which the method includes: loading, from a first subset of the controllable bus lines, multiple weight inputs into the local memory of the first tile; transferring a first group of the weight inputs to cells of the first computational array from the local memory; receiving multiple activation inputs at cells of the first computational array; and performing a computation with the computational array of cells, using the first group of weight inputs and the multiple activation inputs, to provide multiple outputs.

Implementations of the methods may include one or more of the following features. For example, in some implementations, loading the multiple weight inputs into the local memory of the first tile includes receiving an input select signal at a multiplexer that is coupled to the first subset of controllable bus lines. The multiplexer may be coupled to an additional subset of controllable bus lines, and to the local memory. Receiving the input select signal at the multiplexer may includes receiving the input select signal from a register coupled to the multiplexer. The methods may further include: receiving the input select signal from a second tile of the ASIC; and storing the input select signal in the register prior to passing the input select signal to the multiplexer.

In some implementations, the multiple activation inputs are received from the local memory. The methods may further include: prior to the multiple activation inputs being received at the cells of the first computational array, receiving the multiple activation inputs from the first subset of the controllable bus lines; and loading the multiple activation inputs from the first subset of the controllable bus lines in the local memory.

In some implementations, the methods include: receiving instructions from the first subset of the controllable bus lines; and loading the instructions from the first subset of the controllable bus lines in the local memory.

In some implementations, the methods further include: receiving, at the tile, the multiple weight inputs, the multiple activation inputs, and/or instructions, via the first subset of controllable bus lines, from a communication interface of the ASIC.

In some implementations, the methods further include: receiving, at the tile, instructions, via the first subset of controllable bus lines, from a second tile encompasses an additional sub-array of the second larger array of cells.

In some implementations, the methods further include: receiving, at the tile, from a second subset of the controllable bus lines, a first partial sum; adding, from the first computational array of cells, a computational output to the first partial sum to obtain a second partial sum; and outputting the second partial sum to the second subset of the controllable bus lines. The second subset of the controllable bus lines may extend to a second tile that encompasses an additional sub-array of the second larger array of cells. The methods may further include passing the second partial sum from the second subset of the controllable bus lines to a vector processing unit.

Various implementations include one or more of the following advantages. For example, in some implementations, the tiles within the ASIC can include local memory allowing an increase in bandwidth. In some implementations, one or more tiles of the ASIC can be configured as dedicated control tiles for handling writing and reading activation in other tiles within the ASIC. Providing dedicated control tiles may also increase the bandwidth available in memory of other tiles within the ASIC. In some implementations, the tiles of the ASIC can be configured such that data skips at least one tile when transferring data between tiles. Skipping at least one tile can reduce an overall data path length, and thus reduce latency associated with operations performed by the ASIC.

The details of one or more embodiments of the invention are set forth in the accompanying drawings and the description below. Other features and advantages will be apparent from the description, the drawings, and the claims.

BRIEF DESCRIPTION OF THE DRAWINGS

FIGS. 3A, 4A, 5A, 6A, 7, 8A and 9A are schematics that illustrate an overview of a data flow through an ASIC at different times in an exemplary process implemented by the ASIC.

FIGS. 3B, 4B, 5B, 6B, 8B and 9B are schematics that illustrate detail of data flow within a single tile of an ASIC at the times associated with FIGS. 3A, 4A, 5A, 6A, 8A and 9A, respectively.

DETAILED DESCRIPTION

An application-specific integrated circuit (ASIC) is an integrated circuit (IC) that is customized for a particular use. For example, an ASIC may be designed to perform operations of machine learning models including, e.g., recognizing objects in images as part of deep neural networks, machine translation, speech recognition, or other machine learning algorithms. When used as an accelerator for a neural network, for instance, an ASIC can receive inputs to the neural network and compute a neural network inference for the inputs. Data inputs to a neural network layer, e.g., either the input to the neural network or the outputs of another layer of the neural network, can be referred to as activation inputs. The inferences can be computed in accordance with respective sets of weight inputs associated with the layers of the neural network. For example, some or all of the layers may receive a set of activation inputs and process the activation inputs in accordance with the set of weight inputs for the layer to generate outputs.

Figure 1:
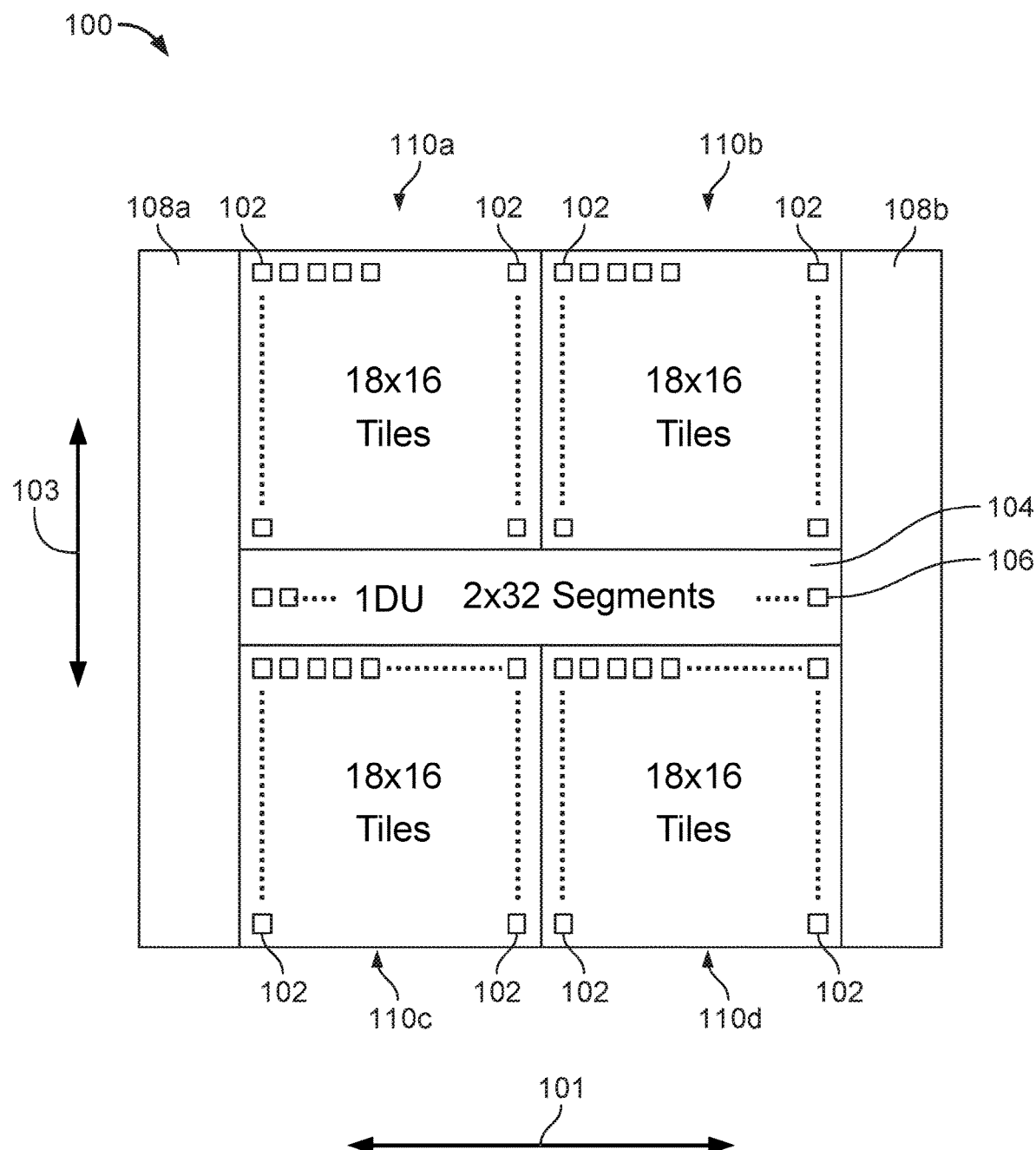
FIG. 1 is a schematic that illustrates an example of special purpose logic circuitry.

FIG. 1 is a schematic that illustrates an example of special purpose logic circuitry, in particular, an ASIC 100. The ASIC 100 includes multiple tiles 102, in which one or more of the tiles 102 includes special purpose circuitry configured to perform operations, such as e.g., multiplication and addition operations. In particular, each tile 102 can include a computational array of cells, in which each cell is configured to perform mathematical operations (see, e.g., the exemplary tile 200 shown in FIG. 2, and described herein). In some implementations, the tiles 102 are arranged in a grid pattern, with tiles 102 arranged along a first dimension 101 (e.g., rows) and along a second dimension 103 (e.g., columns). For instance, in the example shown in FIG. 1, the tiles 102 are divided into four different sections (110a, 110b, 110c, 110d), each section containing 288 tiles arranged in a grid of 18 tiles down by 16 tiles across. In some implementations, the ASIC 100 shown in FIG. 1 may be understood as including a single systolic array of cells subdivided/ arranged into separate tiles, in which each tile includes a subset/sub-array of cells, local memory and bus lines (see, e.g., FIG. 2).

The ASIC 100 also includes a vector processing unit 104. The vector processing unit 104 includes circuitry configured to receive outputs from the tiles 102 and compute vector computation output values based on the outputs received from the tiles 102. For example, in some implementations, the vector processing unit 104 includes circuitry (e.g., multiply circuitry, adder circuitry, shifters, and/or memory) configured to perform accumulation operations on the outputs received from the tiles 102. Alternatively, or in addition, the vector processing unit 104 includes circuitry configured to apply a non-linear function to the outputs of the tiles 102. Alternatively, or in addition, the vector processing unit 104 generates normalized values, pooled values, or both. The vector computation outputs of the vector processing units can be stored in one or more tiles. For example, the vector computation outputs can be stored in memory uniquely associated with a tile 102. Alternatively, or in addition, the vector computation outputs of the vector processing unit 104 can be transferred to a circuit external to the ASIC 100, e.g., as an output of a computation. In some implementations, the vector processing unit 104 is segmented, such that each segment includes circuitry configured to receive outputs from a corresponding collection of tiles 102 and computes vector computation outputs based on the received outputs. For instance, in the example shown in FIG. 1, the vector processing unit 104 includes two rows spanning along the first dimension 101, each of the rows including 32 segments 106 arranged in 32 columns. Each segment 106 includes circuitry (e.g., multiply circuitry, adder circuitry, shifters, and/or memory) configured to perform a vector computation, as explained herein, based on outputs (e.g., an accumulated sum) from a corresponding column of tiles 102. The vector processing unit 104 can be positioned in the middle of the grid of tiles 102 as shown in FIG. 1. Other positional arrangements of the vector processing unit 104 are also possible.

The ASIC 100 also includes a communication interface 108 (e.g., interfaces 108a, 108b). The communication interface 108 includes one or more sets of serializer/deserializer (SerDes) interfaces and a general purpose input/output (GPIO) interface. The SerDes interface is configured to receive instructions (e.g., instructions for operating controllable bus lines described below) and/or input data for the ASIC 100 and to output data from the ASIC 100 to an external circuit. For example, the SerDes interface can be configured to transmit instructions and/or input data at a rate of 32 Gbps, 56 Gbps, or any suitable data rate over the set of SerDes interfaces included within the communications interface 108. The GPIO interface is configured to provide an interface for debugging and/or bootstrapping. For example, the ASIC 100 may run a boot program when it is turned on. If the program fails, an administrator may use the GPIO interface to debug the source of the failure.

The ASIC 100 further includes multiple controllable bus lines (see, e.g., FIG. 2) configured to convey data among the communications interface 108, the vector processing unit 104, and the multiple tiles 102. Controllable bus lines include, e.g., wires that extend along both the first dimension 101 (e.g., rows) of the grid and the second dimension 103 (e.g., columns) of the grid. A first subset of the controllable bus lines extending along the first dimension 101 can be configured to transfer data in a first direction (e.g., to the right of FIG. 1). A second subset of the controllable bus lines extending along the first dimension 101 can be configured to transfer data in a second direction (e.g., to the left of FIG. 1). A first subset of the controllable bus lines extending along the second dimension 103 can be configured to transfer data in a third direction (e.g. to the top of FIG. 1). A second subset of the controllable bus lines extending along the second dimension 103 can be configured to transfer data in a fourth direction (e.g., to the bottom of FIG. 1).

Each controllable bus line includes multiple conveyer elements, such as flip-flops, that are used to convey data along the lines in accordance with a clock signal. Transferring data over a controllable bus line can include shifting, at each clock cycle, data from a first conveyer element of the controllable bus line to a second adjacent conveyer element of the controllable bus line. In some implementations, data is conveyed over the controllable bus lines upon the rising or falling edge of a clock cycle. For example, data present, at a first clock cycle, on a first conveyer element (e.g., a flip-flop) of a controllable bus line can be transferred to a second conveyer element (e.g., a flip-flop) of the controllable bus line at a second clock cycle. In some implementations, the conveyer elements can be periodically spaced apart at a fixed distance from one another. For example, in some cases, each controllable bus line includes multiple conveyer elements, with each conveyer element positioned within or proximate to a corresponding tile 102.

Each controllable bus line also includes multiple multiplexers and/or demultiplexers. A multiplexer/demultiplexer of a controllable bus line is configured to transfer data between the bus line and a component of the ASIC chip 100. For example, a multiplexer/demultiplexer of a controllable bus line can be configured to transfer data to and/or from a tile 102, to and/or from the vector processing unit 104, or to and/or from the communication interface 108. Transferring data among tiles 102, the vector processing unit 104, and the communication interface can include sending control signals to the multiplexers based on the desired data transfer to take place. The control signals can be stored in registers coupled directly to the multiplexer and/or demultiplexers. The value of the control signal then may determine, e.g., what data is transferred from a source (e.g., memory within a tile 102 or a vector processing unit 104) to a controllable bus line or, alternatively, what data is transferred from the controllable bus line to a sink (e.g., memory within a tile 102 or a vector processing unit 104). Further details on controllable bus lines are described herein with respect to FIG. 10.

The controllable bus lines are configured to be controlled on a local level, such that each tile, vector processing unit, and/or communication interface includes its own set of control elements for manipulating the controllable bus lines passing through that tile, vector processing unit, and/or communication interface. For example, each tile, 1D vector processing unit, and communication interface may include a corresponding set of conveyer elements, multiplexers and/or demultiplexers for controlling data transfer to and from that tile, 1D vector processing unit, and communication interface.

To minimize latency associated with operations of the ASIC chip 100, the tiles 102 and vector processing unit 104 can be positioned to reduce the distance data travels among the various components. In a particular implementation, both the tiles 102 and communication interface 108 can be segregated into multiple sections, with both the tile sections and the communication interface sections being arranged such that the maximum distance data travels between a tile and a communication interface is reduced. For instance, in some implementations, a first group of tiles 102 can be arranged in a first section on a first side of the communications interface 108, and a second group of tiles 102 can be arranged in a second section on a second side of the communication interface. As a result, the distance from a communication interface to the furthest tile may be cut in half compared to a configuration in which all of the tiles 102 are arranged in a single section on one side of the communication interface.

Alternatively, the tiles may be arranged in a different number of sections, such as four sections. For instance, in the example shown in FIG. 1, the multiple tiles 102 of ASIC 100 are arranged in multiple sections 110 (110a, 110b, 110c, 110d). Each section 110 includes a similar number of tiles 102 arranged in a grid pattern (e.g., each section 110 can include 256 tiles arranged in 16 rows and 16 columns). The communication interface 108 also is divided into multiple sections: a first communication interface 108a and a second communication interface 108b arranged on either side of the sections 110 of tiles 102. The first communication interface 108a can be coupled, through controllable bus lines, to the two tile sections 110a, 110c on the left side of the ASIC chip 100. The second communication interface 108b can be coupled, through controllable bus lines, to the two tile sections 110b, 110d on the right side of the ASIC chip 100. As a result, the maximum distance data travels (and thus the latency associated with the data propagation) to and/or from a communication interface 108 can be halved compared to an arrangement in which only a single communication interface is available. Other coupling arrangements of the tiles 102 and communication interfaces 108 are also possible to reduce data latency. The coupling arrangement of the tiles 102 and communication interface 108 can be programmed by providing control signals to the conveyer elements and multiplexers of the controllable bus lines.

In some implementations, one or more tiles 102 are configured to initiate reading and writing operations with respect to controllable bus lines and/or other tiles within the ASIC 100 (referred to herein as "control tiles"). The remaining tiles within the ASIC 100 can be configured to perform computations based on the input data (e.g., to compute layer inferences). In some implementations, the control tiles include the same components and configuration as the other tiles within the ASIC 100. The control tiles can be added as an extra tile or tiles, an extra row or rows, or an extra column or columns of the ASIC 100. For example, for a symmetric grid of tiles 102, in which each tile 102 is configured to perform a computation on input data, one or more additional rows of control tiles can be included to handle reading and writing operations for the tiles 102 performing computations on the input data. For instance, each section 110 includes 18 rows of tiles, where the last two rows of tiles may include control tiles. Providing separate control tiles increases, in some implementations, the amount of memory available in the other tiles used to perform the computations. Separate tiles dedicated to providing control as described herein are not necessary, however, and in some cases, no separate control tiles are provided. Rather, each tile may store in its local memory instructions for initiating reading and writing operations for that tile.

Furthermore, while each section 110 shown in FIG. 1 includes tiles arranged in 18 rows by 16 columns, the number of tiles 102 and their arrangement in a section can be different. For example, in some cases, the sections 110 may include an equal number of rows and columns.

Furthermore, although shown in FIG. 1 as divided into four sections, the tiles 102 can be divided into other different groupings. For example, in some implementations, the tiles 102 are grouped into two different sections, such as a first section above the vector processing unit 104 (e.g., nearer the top of the page shown in FIG. 1) and a second section below the vector processing unit 104 (e.g., nearer to the bottom of the page shown in FIG. 1). In such an arrangement, each section may contain, e.g., 576 tiles arranged in a grid of 18 tiles down (along direction 103) by 32 tiles across (along direction 101). Sections may contain other total numbers of tiles and may be arranged in different sized arrays. In some cases, the divisions between sections are delineated by hardware features of the ASIC 100. For example, as shown in FIG. 1, sections 110a, 110b may be separated from sections 110c, 110d by the vector processing unit 104.

Latency also may be reduced by centrally locating the vector processing unit 104 relative to the tile sections 110. In some implementations, a first half of the tiles 102 are arranged on a first side of the vector processing unit 104, and a second half of the tiles 102 are arranged on a second side of the vector processing unit 104.

For example, in the ASIC chip 100 shown in FIG. 1, the vector processing unit 104 includes two sections (e.g., two rows), each of which includes a number of segments 106 that matches the number of columns of tiles 102. Each segment 106 can be positioned and configured to receive an output, such as an accumulated sum, from a corresponding column of tiles 102 within a section 110 of tiles. In the example shown in FIG. 1, the tile sections 110a, 110b positioned on a first side of the vector processing unit 104 (e.g., above the vector processing unit 104) can be coupled, through controllable bus lines, to the top row of segments 106. The tile sections 110c, 110d positioned on a second side of the vector processing unit 104 (e.g., below the vector processing unit 104) can be coupled, through controllable bus lines, to the bottom row of segments 106. Furthermore, each tile 102 within the first half above the processing unit 104 can be positioned at a same distance from the vector processing unit 104 as a respective tile 102 within the second half below the processing unit 104, such that there is no difference in overall latency between the two halves. For instance, the tiles 102 in row i in the first section 110a (where the variable i corresponds to the row position) can be positioned at the same distance away from vector processing unit 104 as the tiles 102 in row m−1−i in a second section of tiles (e.g., the section 110c) (where m represents the total number of rows in each section, and assuming rows are incremented along the same direction in both sections).

Configuring the tile sections 110 in this manner can halve the distance data travels (and thus the latency associated with the data propagation) to and/or from the vector processing unit 104 compared to an arrangement in which the vector processing unit 104 is positioned at a far end (e.g., the bottom) of all the tiles 102. For instance, the latency associated with receiving an accumulated sum through a column of tiles 102 from section 110a can be half the latency associated with receiving an accumulated sum through a column of tiles 102 from sections 110a and 110c. The coupling arrangements of the tiles 102 and the vector processing unit 104 can be programmed by providing control signals to the conveyer elements and multiplexers of the controllable bus lines.

During operation of the ASIC chip 100, activation inputs may be shifted between tiles. For example, activation inputs can be shifted along the first dimension 101. In addition, outputs from computations performed by the tiles 102 (e.g., outputs of computations performed by computational array within the tile 102) can be shifted along the second dimension 103 between tiles.

In some implementations, the controllable bus lines can be physically hardwired to cause data to skip tiles 102 to reduce latency associated with the operations of the ASIC chip 100. For example, an output of a computation performed by a first tile 102 can be shifted along the second dimension 103 of the grid to a second tile 102 positioned at least one tile away from the first tile 102, thus skipping the tile in between. In another example, an activation input from a first tile 102 can be shifted along the first dimension 101 of the grid to a second tile 102 positioned at least one tile away from the first tile 102, thus skipping the tile in between. By skipping at least one tile when shifting the activation input or the output data, the overall data path length can be reduced, such that the data is transferred faster (e.g., there is no need to utilize a clock cycle to store data at the skipped tile), and latency is reduced.

In an example implementation, each tile 102 within each column of section 110*a* can be configured, through the controllable bus lines, to pass output data along the second dimension 103 toward the vector processing unit 104. The tiles 102 within each column can be further configured to pass the data toward the vector processing unit 104 by skipping the next adjacent tile (e.g., through physical hard-wiring of the controllable bus lines between tiles). That is, a tile 102 at a position (i, j)=(0, 0) in the first section 110*a* (where the variable i corresponds to the row position and the variable j corresponds to the column position) can be hardwired to pass output data to a tile 102 at a position (i, j)=(2, 0); similarly, the tile 102 at a position (i, j)=(2, 0) in the first section 110*a* can be hardwired to pass output data to a tile 102 at a position (i, j)=(4, 0), and so forth. The last tile that is not skipped (e.g., the tile 102 located at position (i, j)=(16, 0)) passes output data to the vector processing unit 104. For a section 110 having 18 rows of tiles, such as the example shown in FIG. 1, the tile skipping ensure that all tiles within a section 110 are at most 9 "tile hops" away from the vector processing unit 104, thus improving the ASIC chip 100 performance by reducing the data path length and resulting data latency by half.

In another example implementation, each tile 102 within each row of sections 110*a*, 110*c* and within each row of sections 110*b*, 110*d* can be configured, through the controllable bus lines, to pass activation inputs along the first dimension 101. For example, some tiles within the sections 110*a*, 110*b*, 110*c*, 110*d* can be configured to pass activation inputs toward a center of the grid 100 or toward the communication interfaces 108. The tiles 102 within each row can be further configured skip adjacent tiles, e.g., by hardwiring the controllable bus lines between tiles. For example, a tile 102 at a position (1,1)=(0, 0) in the first section 110*a* (where the variable i corresponds to the row position and the variable j corresponds to the column position) can be configured to pass activation inputs to a tile 102 at a position (i, j)=(0, 2); similarly, a tile 102 at a position (i, j)=(0, 2) in the first section 110*a* can be configured to pass activation inputs to a tile 102 at a position (i, j)=(0, 4), and so forth. In some cases, the last tile that is not skipped (e.g., the tile 102 located at position (i, j)=(0, 14)) does not pass the activation input on to another tile.

Similarly, tiles that are skipped may pass activation inputs in the opposite direction. For example, a tile 102 at a position (i, j)=(0, 15) in the first section 110*a* (where the variable i corresponds to the row position and the variable j corresponds to the column position) can be configured to pass activation inputs to a tile 102 at a position (i, j)=(0, 13); similarly, a tile 102 at a position (i, j)=(0, 13) in the first section 110*a* can be configured to pass activation inputs to a tile 102 at a position (i, j)=(0, 11), and so forth. In some cases, the last tile that is not skipped (e.g., the tile 102 located at position (i, j)=(0, 1)) does not pass the activation input on to another tile. By skipping tiles, it is possible, in some implementations, to improve the ASIC chip 100 performance by reducing the data path length and resulting data latency by half.

As explained herein, in some implementations, one or more of the tiles 102 are dedicated to storing control information. That is, the tiles 102 dedicated to storing control information do not take part in performing calculations on input data such as weight inputs and activation inputs. Control information can include, e.g., control data for configuring the controllable bus lines during operation of the ASIC chip 100 so that data can be moved around the ASIC chip 100. The control data can be provided to the controllable bus lines in the form of control signals for controlling the conveyer elements and multiplexers of the controllable bus lines. The control data specifies whether particular conveyer elements of the controllable bus lines pass data to a next conveyer element of the controllable bus line so that data is transferred among the tiles according to a predetermined schedule. The control data additionally specifies whether data is transferred from or to a bus line. For example, the control data can include control signals that direct a multiplexer to transfer data from a bus line to memory and/or other circuitry within a tile. In another example, the control data can include control signals that direct a multiplexer to transfer data from the memory and/or circuitry within the tile to the bus line. In another example, the control data can include control signals that direct a multiplexer to transfer data between a bus line and the communications interface 108 and/or between the bus line and the vector processing unit 104. Alternatively, as disclosed herein, dedicated control tiles are not used. Rather, in such cases, the local memory of each tile stores the control information for that particular tile.

Figure 2:
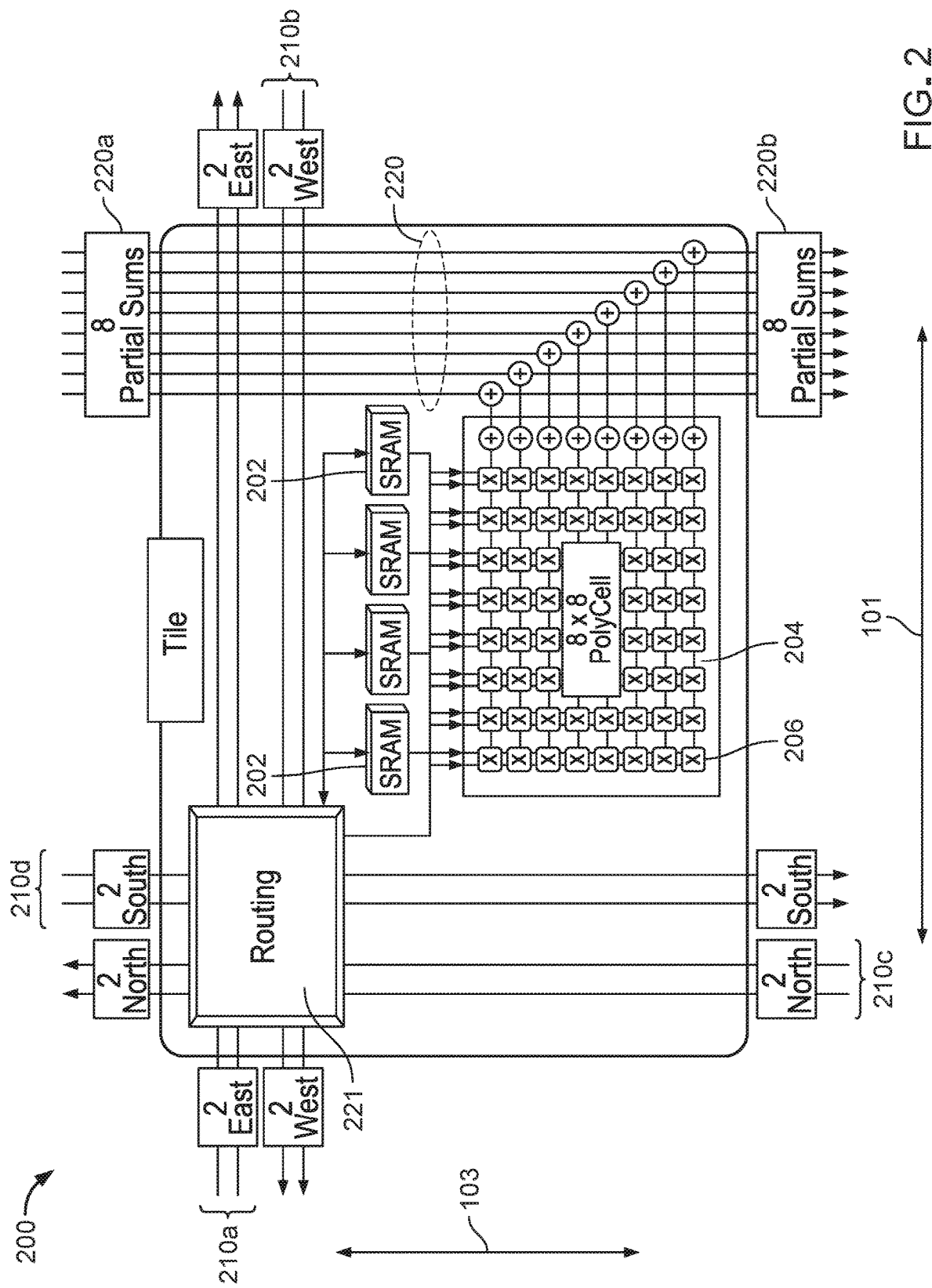
FIG. 2 is a schematic that illustrates an example of a tile for use in the ASIC chip of FIG. 1.

A schematic illustrating an example of a tile 200 for use in the ASIC chip 100 is shown in FIG. 2. Each tile 200 includes local memory 202 and a computational array 204 coupled to the memory 202. The local memory 202 includes physical memory positioned proximate to the computational array 204. The computational array 204 includes multiple cells 206. Each cell 206 of the computational array 204 includes circuitry configured to perform a computation (e.g., a multiply and accumulate operation) based on data inputs, such as activation inputs and weight inputs, to the cell 206. Each cell can perform the computation (e.g., the multiply and accumulation operation) on a cycle of the clock signal. The computational array 204 can have more rows than columns, more columns than rows, or an equal number of columns and rows. For instance, in the example shown in FIG. 2, the computational array 204 includes 64 cells arranged in 8 rows and 8 columns. Other computational array sizes are also possible, such as computational arrays having 16 cells, 32 cells, 128 cells, or 256 cells, among others. Each tile can include the same number of cells and/or the same size computational array. The total number of operations that can be performed in parallel for the ASIC chip then depends on the total number of tiles having the same size computational array within the chip. For example, for the ASIC chip 100 shown in FIG. 1, which contains approximately 1150 tiles, this means that approximately 72,000 computations can be performed in parallel every cycle. Examples of clock speeds that may be used include, but are not limited to, 225 MHz, 500 MHz, 750 MHz, 1 GHz, 1.25 GHz, 1.5 GHz, 1.75 GHz, or 2 GHz. The computational arrays 204 of each individual tile is a subset of the larger systolic array of tiles, as illustrated in FIG. 1.

The memory 202 contained in the tile 200 can include, e.g., random-access memory (RAM), such as SRAM. Other memory can be used instead. Each memory 202 can be configured to store $(1/n)^{th}$ of the total memory associated with n tiles 102 of the ASIC chip. The memory 202 can provided as a single chip or in multiple chips. For example, memory 202 shown in FIG. 2 is provided as four single-port SRAMs, each of which is coupled to the computational array 204. Alternatively, the memory 202 can be provided as two single-port SRAMs or eight single-port SRAMS, among other configurations. The joint capacity of the memory can be, but is not limited to, e.g., 16 kB, 32 kB, 64 kB, or 128 kB, after error correction coding. By providing the physical memory 202 locally to the computational arrays, the density of wiring for the ASIC 100 can be, in some implementations, vastly reduced. In an alternate configuration in which memory is centralized within the ASIC 100, as opposed to provided locally as described herein, may require a wire for each bit of memory bandwidth. The total number of wires needed to cover each tile of the ASIC 100 would far exceed the available space within the ASIC 100. In contrast, with dedicated memory provided for each tile, the total number of required to span the area of the ASIC 100 can be substantially reduced.

The tile 200 also includes controllable bus lines. The controllable bus lines may be categorized into multiple different groups. For example, the controllable bus lines can include a first group of general purpose controllable bus lines 210 configured to transfer data among tiles in each cardinal direction. That is, the first group of controllable bus lines 210 can include: bus lines 210a configured to transfer data toward a first direction along the first dimension 101 of the grid of tiles (referred to as "East" in FIG. 2); bus lines 210b configured to transfer data toward a second direction along the first dimension 101 of the grid of tiles (referred to as "West" in FIG. 2), in which the second direction is opposite to that of the first direction; bus lines 210c configured to transfer data toward a third direction along the second dimension 103 of the grid of tiles (referred to as "North" in FIG. 2); and bus lines 210d configured to transfer data toward a fourth direction along the second dimension 103 of the grid of tiles (referred to as "South" in FIG. 2), in which the fourth direction is opposite to the third direction. General purpose bus lines 210 can be configured to carry control data, activation input data, data from and/or to the communications interface, data from and/or to the vector processing unit, and data to be stored and/or used by the tile 200 (e.g., weight inputs). The tile 200 may include one or more control elements 221 (e.g., flip-flops and multiplexers) for controlling the controllable bus lines, and thus routing data to and/or from the tile 200 and/or from memory 202.

The controllable bus lines also can include a second group of controllable bus lines, referred to herein as computational array partial sum bus lines 220. The computational array partial sum bus lines 220 can be configured to carry data output from computations performed by the computational array 204. For example, the bus lines 220 can be configured to carry partial sum data obtained from the rows in the computational array 204, as shown in FIG. 2. In such case, the number of bus lines 220 would match the number of rows in the array 204. For instance, for a 8×8 computational array, there would be 8 partial sum bus lines 220, each of which is coupled to the output of a corresponding row in the computational array 204. The computational array output bus lines 220 can be further configured to couple to another tile within the ASIC chip, e.g., as inputs to a computational array of another tile within the ASIC chip. For example, the array partial sum bus lines 220 of tile 200 can be configured to receive inputs (e.g., partial sums 220a) of a computational array of a second tile that is located at least one tile away from the tile 200. The outputs of computational array 204 then are added to the partial sum lines 220 to produce new partial sums 220b, which may be output from the tile 200. The partial sums 220b then may be passed to another tile or, alternatively, to the vector processing unit. For example, each bus line 220 may be coupled to a corresponding segment (such as segments 106 in FIG. 1) of the vector processing unit.

As explained with respect to FIG. 1, the controllable bus lines can include circuitry such as conveyer elements (e.g., flip-flops) configured to allow data to be conveyed along the bus lines. In some implementations, each controllable bus line includes, for each tile, a corresponding conveyer element. As further explained with respect to FIG. 1, the controllable bus lines can include circuitry such as multiplexers configured to allow data to be transferred among the different tiles, the vector processing unit and the communications interface of the ASIC chip. The multiplexers can be located wherever there is a source or sink for data. For example, in some implementations, as shown in FIG. 2, control circuitry 221, such as multiplexers, can be located at crossings of controllable bus line (e.g., at the crossing of general purpose bus lines 210a and 210d, at the crossing of general purpose bus lines 210a and 210c, at the crossing of general purpose bus lines 210b and 210d, and/or at the crossing of general purpose bus lines 210b and 210c). The multiplexers at the bus line crossings can be configured to transfer data between the bus lines at the crossings. Accordingly, by proper operation of the multiplexers, it can be possible to change the direction in which data travels over the controllable bus lines. For example, data traveling along the first dimension 101 on general purpose bus lines 210a can be transferred to general purpose bus lines 210d, such that the data instead travels along the second dimension 103. In some implementations, multiplexers can be located adjacent to the memory 202 of the tile 200 so that data can be transferred to and/or from memory 202.

FIGS. 3A-9B are schematics that illustrate an example process in which the ASIC 100 is used as a hardware accelerator for computing neural network inferences. FIGS. 3A, 4A, 5A, 6A, 7, 8A and 9A are schematics that illustrate an overview of data flow through the ASIC 100 at different times in the process. FIGS. 3B, 4B, 5B, 6B, 8B and 9B are schematics that illustrate data flow within a single tile (e.g., a control tile or other tile 102) of the ASIC 100 at the times associated with FIGS. 3A, 4A, 5A, 6A, 8A and 9A, respectively. The ellipses in FIGS. 3A-9B indicate the presence of repeating features that are not shown in the figures. A compass 300 is provided in each of FIGS. 3A-9B to provide orientation for data flow. The labels "N," "W," "S" and "E" do not correspond to actual geographic directions, but instead are used to indicate different relative directions in which data can flow through the grid. Controllable bus lines conveying data in the directions indicated by the labels "N," "W," "S" and "E" are referred to herein as north-flowing bus lines, west-flowing bus lines, south-flowing bus lines, and east-flowing bus lines.

The arrangement of tiles 102 and vector processing unit 104 in FIGS. 3A-9A is similar to the arrangement shown in FIG. 1. For example, half of the tiles 102 can be arranged on a first side of the vector processing unit 104 and the other half of tiles 102 can be arranged on a second opposite side of the vector processing unit 104. The communication interfaces 108 are shown in FIGS. 3A-9A as arranged on entirely on the right side of the tile grid, but can be positioned on either side of the tile grid as depicted in the schematic of FIG. 1.

In a first step, as shown in FIG. 3A, input values (e.g., activation inputs and/or weight inputs) for a first layer of a model (e.g., a neural network model) are loaded from the communication interfaces 108 onto one or more tiles 102 (e.g., all of the tiles 102) within the ASIC 100. In some implementations, one or more the tiles 102 onto which the input values are loaded also can be dedicated to storing control information and/or output information from the vector processing unit 104. Such tiles may be referred to herein as "control tiles." Control tiles include tiles 102 of the ASIC 100 that are configured to provide programs, also referred to as control instructions (e.g., instructions to perform read and/or write operations with respect to the controllable bus lines) to other tiles 102. The programs/control instructions may be received in a tile 102 (a control tile or any tile in the ASIC as described herein) from a circuit element external to the tile, such as the communication interface. The input values provided to the one or more control tiles can include, e.g., weight inputs and/or activation inputs for a neural network layer and is represented as dots 301 in FIGS. 3A-3B. In some implementations, the one or more control tiles are positioned directly adjacent to the vector processing unit 104. By positioning the one or more control tiles directly adjacent to the vector processing unit 104, the data path length required for output data to pass from the vector processing unit 104 to the one or more control tiles can be reduced (e.g., in cases where the one or more control tiles are configured to store output data from the vector processing unit 104).

The remaining tiles 102 within the ASIC 100 can be configured to perform computations based on input data (e.g., weight inputs and activation inputs) received from the control tiles, communication interface 108, and/or vector processing unit 104. In some implementations, such as shown in the examples of FIGS. 3A-9B, control tiles and the remaining tiles 102 of the ASIC 100 include the same components and configuration.

From the communications interfaces 108, the input values follow a data path along the controllable bus lines (e.g., such as the general purpose controllable bus lines described herein) to the one or more control tiles. The data can be transferred between different bus lines through the use of multiplexers at locations where the different bus lines cross (e.g., see routing element 221 in FIG. 2). For example, as shown in FIG. 3A, the input data flows along a data path that entails traveling on west-flowing general purpose controllable bus lines and then on south-flowing general purpose controllable bus lines. The input data can be transferred from the west-flowing bus lines to the south-flowing bus lines through the use of multiplexers at locations where the west-flowing bus lines and south-flowing bus lines cross. In some implementations, the weight inputs for a second inference can be loaded to the one or more control tiles while a previous first inference is being executed by the ASIC 100.

FIG. 3B is a schematic that illustrates a detailed view of an example of a tile 102, from the ASIC 100. As shown in FIG. 3B, the tile 102 can include memory 302 on which the input values are stored. Memory 302 can include any suitable memory as described herein with respect to FIG. 2. The input values are obtained from one or more south-flowing general purpose controllable bus lines 310d that pass adjacent to or through the tile 102. The data from the south-flowing controllable bus lines 310d can be transferred to the memory 302 through the use of a multiplexer. Other general purpose controllable bus lines (310a, 310b, 310c) are not used during this step.

Tile 102 also includes a computational array of cells 306 directly coupled to memory 302. As explained herein, the computational array of cells 306 may be a subset of a larger systolic array of cells that makes up the tiles of the ASIC. The cells 306 are arranged in an array, with a single cell 306 shown in FIG. 3B at a position (i,j)=(0, 0), where the parameter i represents a cell row position within the array and j represents a cell column position in the array. In the example shown in FIG. 3B, the computational array has 8 rows and 8 columns, though other sizes also are possible. Each cell 306 of the computational array can include circuitry configured to perform computations based on data received at the tile. For example, each cell 306 can include multiplier circuitry, adder circuitry, and one or more registers. The output of each cell 306 can be passed as a partial sum to an adjacent cell within the computational array or to a cell within a computational array of another tile in the ASIC 100. The computational array of cells 306 is used in later steps.

The tile 102 also includes controllable bus lines 320 for providing data from previous tiles. For example, the controllable bus lines 320 can carry partial sum output data obtained from a computational array of a previous tile in the ASIC 100 and provide the partial sum output data as an input to the cells of the computational array within tile 102. Controllable bus lines 320 are not used in this step.

The tile 102 also includes controllable bus lines 330 for providing activation input values as an input to the cells 306 of the computational array. For example, the activation input values can be provided to multiplier circuitry within the cell 306. The activation input values can be obtained from the communications interface 108 or from cells within another tile in the ASIC 100. The data from the controllable bus lines 330 can be transferred to the cells 306 through the use of a multiplexer. Controllable bus lines 330 are not used in the example step depicted in FIGS. 3A-3B.

As explained herein, in some implementations, one or more tiles 102 are dedicated to storing control information and/or output information from the vector processing unit 104. In some implementations, the computational arrays within the one or more control tiles may not be used to perform computations. Alternatively, the one or more control tiles can be configured to store control data in addition to performing computations on input data, such as received weight inputs and activation values. In some implementations, the weight inputs are loaded into the memory of each tile 102 where the weight inputs will be used, without first storing the weight inputs in a subset of one or more control tiles.

In a second step, as shown in FIG. 4A, weight inputs 301 are loaded into the individual cells 306 of the computational arrays within the tiles 102. Loading the weight inputs 301 into the individual cells 306 can include transferring the data from the memory of one or more control tiles to the corresponding tiles 102 in which the weight inputs 301 belong. The weight inputs 301 can be conveyed along the general purpose controllable bus lines to the tiles 102 and transferred to the memory through multiplexers coupled to the bus lines and memory. FIG. 4B is a detailed view of an example of a tile 102. The weight inputs 301 can be stored in the memory 302 for the duration of the model execution, which may include computation of multiple inferences. As an alternative to loading the weight inputs 301 from the one or more control tiles, the weight inputs 301 may have been pre-loaded into the memory of tiles 102 directly from the communication interfaces 108. To prepare a model for execution, the weight inputs 301, for each tile 102, can be loaded from the memory 302 of the tile 102 into each cell 306 of the computational array within that tile 102. For example, the weight inputs 301 can be loaded into a register 400 (also referred to as a "back register") within the cell 306. The use of back registers allows a computation to be performed by the cell 306 on a current weight input while a next weight input is loaded into the back register. Although loading weight registers is shown for only one cell 306 in FIG. 4B, weight registers of other cells within the computational array also can be loaded during this step.

In a third step, as shown in FIG. 5A, activation values 500 are introduced into the tiles 102 and may be stored within memory 302 there. The activation values 500 can be transferred over multiple clock cycles. Computations then are performed by the computational arrays of each tile 102 with the received activation values 500 and the weight inputs 301 from the memory 302 in the tile 102. For example, the computation can include multiplying an activation value by a weight input and then summing the result with the product of a different weight input and activation value. In some implementations, the activation values 500 are conveyed to and between tiles 102 on controllable bus lines 330. Each of the controllable bus lines 330 can extend along a same direction. For example, as shown in FIG. 5B, the controllable bus lines 330 extend laterally along a grid dimension that is orthogonal to a grid dimension along which controllable bus lines 320 extend. Furthermore, as indicated by the arrows 501 in FIG. 5A, and the arrows 501 on controllable bus lines 330 in FIG. 5B, the activation input data 500 travels on the bus lines 330 in the same (e.g., east-flowing) direction. Alternatively, in some implementations, some of the activation input values 500 travel on some of the controllable bus lines 330 in a first direction (e.g., east-flowing direction) and some other activation input values 500 travel on some other controllable bus lines 330 in a second opposite direction (e.g., west-flowing direction). In some implementations, the activation input data 500 is conveyed along the controllable bus lines 330 such that at least one tile 102 is skipped. For instance, activation input data 500 may be provided to a first tile in a first row of tiles in the ASIC, and then conveyed from the first tile to a second tile in the first row in which the second tile is located at least one tile away from the first tile.

In some implementations, the number of controllable bus lines 330 that extend through each tile 102 is determined by the size of the computational array. For example, the number of controllable bus lines 330 that extend through each tile 102 may be equal to at least the number of rows of cells within the computational array. In the example shown in FIG. 5B, there are 8 controllable bus lines 330 that pass through tile 102 given that there are 8 rows of cells 306 within the computational array of tile 102. In some implementations, each separate controllable bus line 330 transfers activation input values 500 to the cells 306 within a corresponding row of the computational array. For instance, for an 8×8 computational array of cells 306 within a tile 102, a first controllable bus line 330 transfers activation input values 500 to the cells 306 within a first row of the array, a second controllable bus line 330 transfers activation input values 500 to the cells 306 within a second row of the array, etc., up to the last controllable bus line 330, which transfers activation input values 500 to the cells 306 within the last row of the array. Additional controllable bus lines (e.g., partial sum bus lines) may pass through each tile to provide partial sums from another tile, to receive and combine results of computations within the tile to the provided partial sums, and to output the new partial sums to a new tile or to the vector processing unit.

In some implementations, the controllable bus lines 330 transfer the activation input values 500 to circuitry configured to perform a computation within the cell 306. For example, as shown in FIG. 5B, the controllable bus lines 330 are configured to transfer activation input values 500 to multiplier circuit 502 within the cell 306. The activation input values 500 can be transferred to the multiplier circuit 502 through the use of multiplexers on the controllable bus lines 330.

In some implementations, once the activation input values 500 and weight input values 301 are determined to be in place (e.g., by inspecting control signals), the cells 306 of the computational array within the tile 102 perform a computation using the received activation input values 500 and the weight input values 301 from the memory 302 in the tile 102. For example, as shown in FIG. 5B, the weight input values 301 that were previously stored in register 400 are transferred to register 504 (also referred to as a "front register"). Then, using the multiplier circuit 502, the weight input values 301 are multiplied with the received activation input values 500.

As explained herein, the activation input values 500 are conveyed on controllable bus lines 330. In some implementations, the controllable bus lines 330 are general purpose controllable bus lines. In some implementations, the controllable bus lines 330 can be dedicated to providing activation inputs. For example, as shown in FIG. 5B, activation input values can be provided to a tile 102 (e.g., to the cells 306 of a computational array within the tile 102) by lines 330, whereas other general purpose controllable bus lines 310b can be used to provide other data and/or instructions to the tile 102.

Figure 6B:
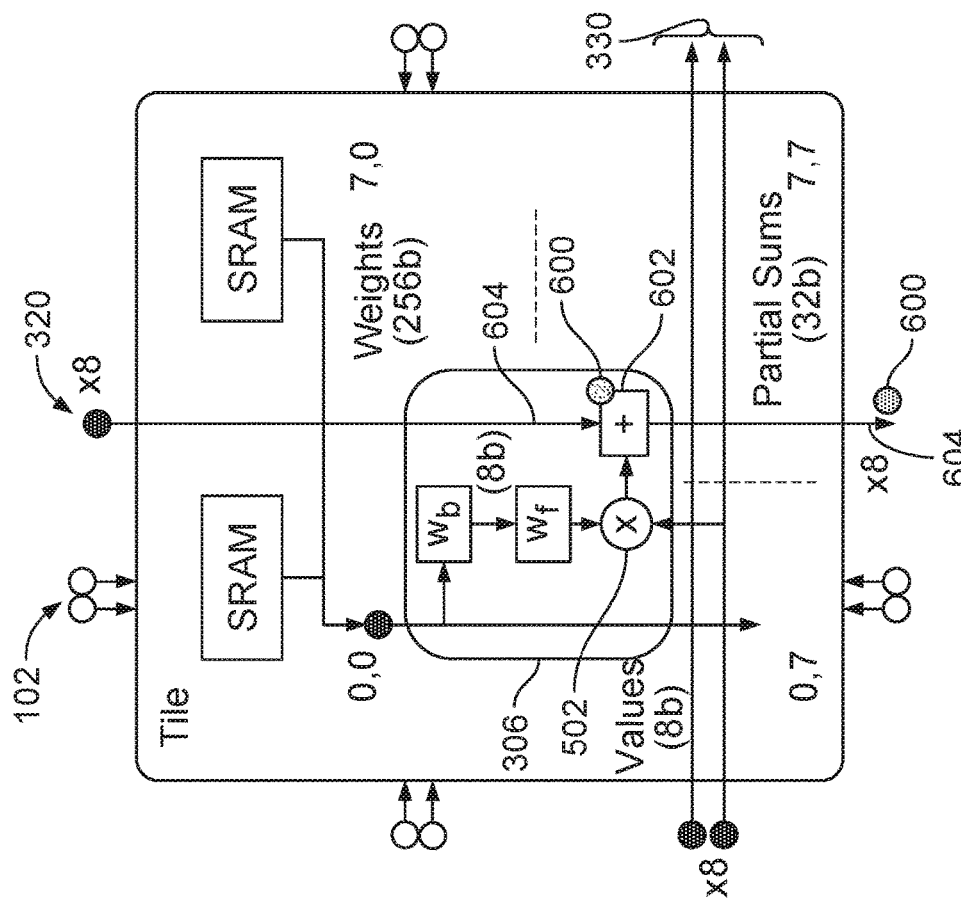
Figure 6A:
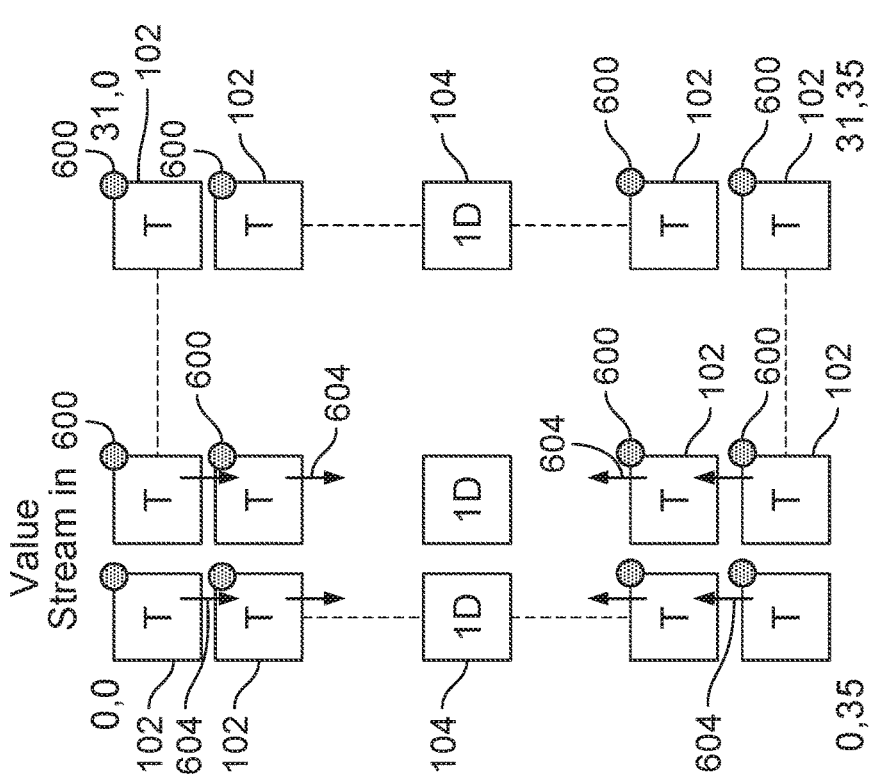

In a fourth step, as shown in FIG. 6B, a result of a computation between the weight input values 301 and the activation input values 500, within each cell 306, is passed to circuitry 602 within the cell 306 to produce an output value 600. In the example of FIG. 6B, the circuitry 602 includes a summation circuit. The summation circuit 602 within each cell 306 is configured to sum the product of the multiplier circuit 502 with another value obtained from either another tile 102 in the ASIC 100 or from another cell 306 within the computational array. The value obtained from another tile 102 or from another cell 306 can include, e.g., an accumulated value. Accordingly, the output value 600 of the summation circuit 602 is a new accumulated value. The summation circuit 602 then can send the new accumulated value 600 to another cell located in a bottom (e.g., in a south-flowing direction) adjacent cell of the computational array within the tile 102. The new accumulated value 600 can be used as an operand for a summation in the bottom adjacent cell. For the last row of cells within the computational array, the new accumulated values 600 can be transferred to another tile 102 within the ASIC 100, as shown in FIG. 6A. In another example, the new accumulated values 600 can be transferred to another tile 102 that is at least one tile away from the tile 102 in which the new accumulated values 600 were generated. Alternatively, as also shown in FIG. 6A, the new accumulated values 600 from the last row of cells within the computational array are transferred to the vector processing unit 104.

The accumulated values 600 that are transferred into a tile 102 or transferred out of a tile 102 can be conveyed along controllable bus lines 320. Each of the controllable bus lines 320 extend along a same direction. For example, as shown in FIG. 6B, the controllable bus lines 320 extend vertically along a grid dimension that is orthogonal to a grid dimension along which controllable bus lines 330 extend. Furthermore, as indicated by the arrows 604 in FIG. 6A, and the arrows 604 in FIG. 6B, the accumulated values 600 travel on the controllable bus lines 320 in either a north-flowing or south-flowing direction depending on the location of the vector processing unit 104 relative to the tiles 102 from which the accumulated values 600 are generated. For example, for the tiles 102 located above the vector processing unit 104 in FIG. 6A, the accumulated values 600 travel on the controllable bus lines 320 in a south-flowing direction towards the vector processing unit 104, whereas for the tiles 102 located below the vector processing unit 104, the accumulated values 600 travel in a north-flowing direction towards the vector processing unit 104.

In some implementations, the number of controllable bus lines 320 that provide accumulated values entering a tile 102 is determined by the size of the computational array. For example, the number of controllable bus lines 320 that provide accumulated values entering a tile 102 equals the number of columns of cells within the computational array. In the example shown in FIG. 6B, there are 8 controllable bus lines 320 entering tile 102 given that there are 8 columns of cells 306 within the computational array of tile 102. In some implementations, each separate controllable bus line 320 that enters the tile 102 transfers an accumulated value 600 to a different corresponding cell 306 in the first row of cells of the computational array. As explained herein, the accumulated value 600 received in each cell then is used as an operand to produce a new accumulated value, which is passed to an adjacent cell within the array.

Similarly, in some implementations, the number of controllable bus lines 320 that provide accumulated values exiting a tile 102 also is determined by the size of the computational array. For example, the number of controllable bus lines 320 that provide accumulated values exiting a tile 102 equals the number of columns of cells within the computational array. For instance, each separate controllable bus line 320 transfers a new accumulated value 600 from a different corresponding cell 306 in a last row of cells of the computational array to either another tile 102 within the ASIC 100 or to the vector processing unit 104.

Figure 7:
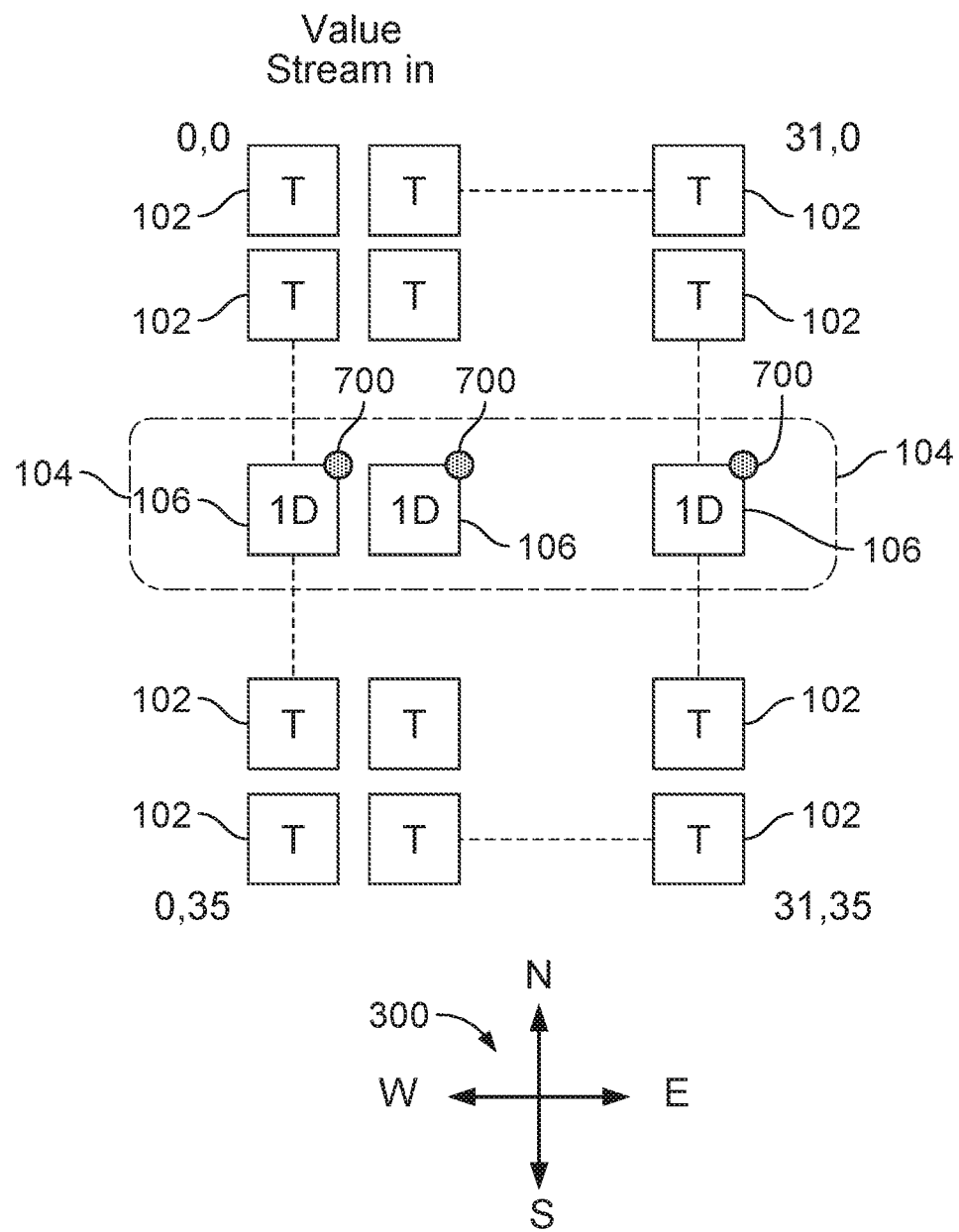

In a fifth step as shown in FIG. 7, the data (e.g., the accumulated values) received by the vector processing unit 104 are processed by the vector processing unit 104 to provide processed values 700. Processing of the data at the vector processing unit 104 can include applying a bias to the data received at the vector processing unit 104, performing additional accumulation operations, and/or applying a non-linear function (e.g., a rectifier function or sigmoid function as known in neural network systems) to the received data. Other operations also can be applied by the vector processing unit 104. The vector processing unit 104 can include circuitry arranged in multiple segments 106, in which each segment 106 is configured to process data received from a corresponding column of tiles 102 and generate a corresponding processed value 700.

Figures 8A, 8B:
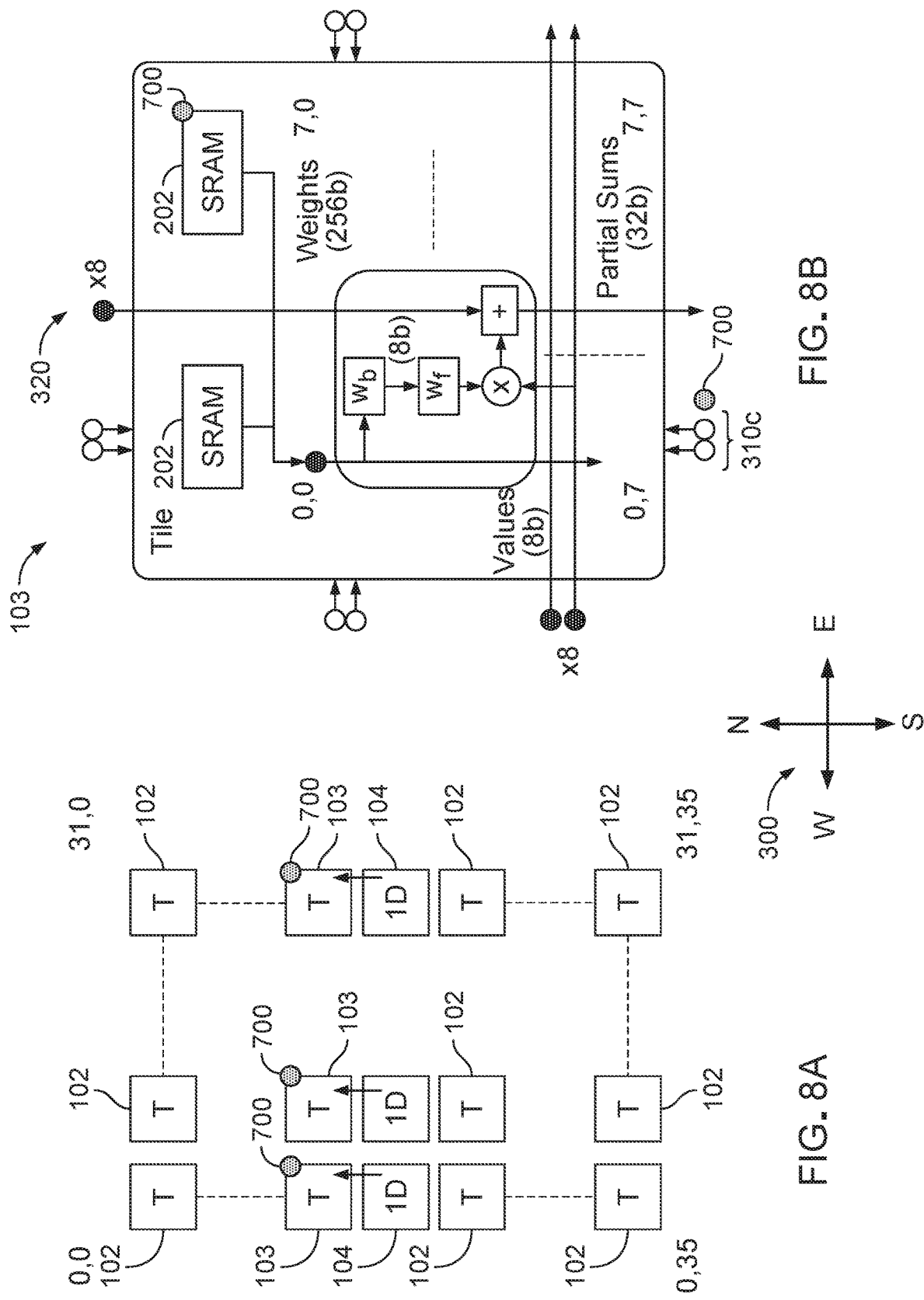

In a sixth step, as shown in FIG. 8A, the processed values 700 from the vector processing unit 104 are transferred to and stored in one or more tiles of the ASIC 100, e.g., a subset of the tiles of the ASIC 100. For example, the processed values 700 can be sent to the control tiles 103, which are located directly adjacent to the vector processing unit 104. Alternatively, or in addition, the processed values 700 can be sent to one or more of the other tiles 102 within the ASIC 100. The processed values 700 can be transferred to one or more tiles over a general purpose controllable bus line, such as controllable bus lines 310c. Upon reaching a tile (e.g., a control tile or other tile 102), the processed values 700 can be stored in the memory 202 of the tile. For example, the processed values 700 can be transferred to the memory 702 using a multiplexer associated with the controllable bus line 310c. The step of storing the processed values 700 can occur after the inferences of each model layer are obtained. In some implementations, the processed values 700 can be provided as input values to a next layer of the model.

In a seventh step, as shown in FIGS. 9A and 9B, the processed values 700 can be exported off the ASIC 100. For example, the processed values 700 can be transferred from the memory 202 of the one or more control tiles to the communications interface 108. The processed values 700 can be conveyed to the communications interface 108 on controllable bus lines (e.g., controllable bus lines 310c and/or 310d). The processed values 700 can be transferred to the controllable bus lines through multiplexers associated with the bus lines.

The processed values 700 may be exported off the ASIC 100, e.g., if the inferences for a final layer of a model have been obtained or if the model has been partitioned among multiple ASICs and the inferences for the final layer associated with ASIC 100 have been obtained. The processed values 700 can be received and exported by the SerDes interfaces of the communications interface 108 to another destination including, but not limited to, e.g., another ASIC 100 or a field-programmable gate array chip.

Figure 10:
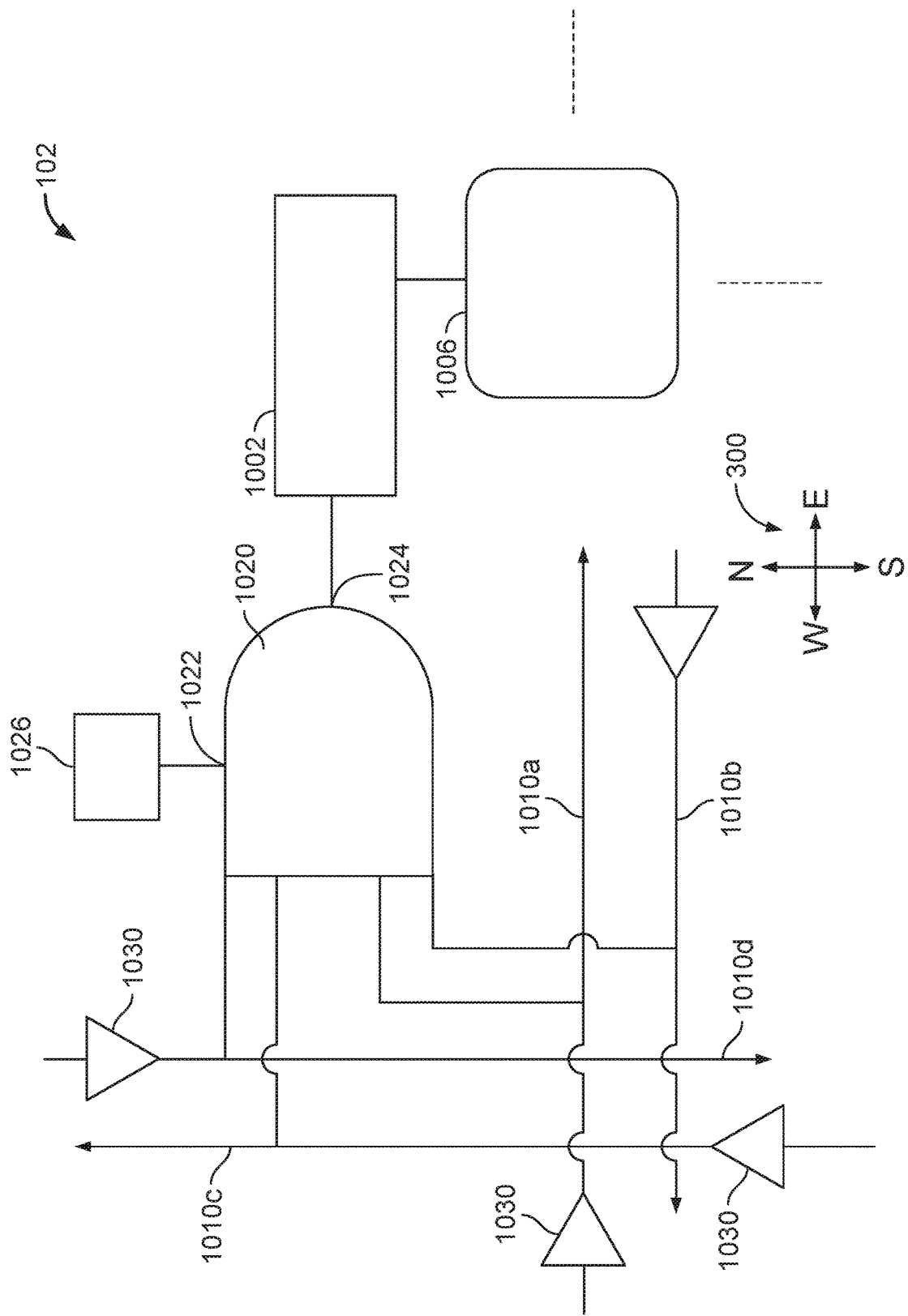
FIG. 10 is a schematic that illustrates an example of controllable bus lines within a tile.

FIG. 10 is a schematic that illustrates an example of controllable bus lines within a tile 102, such as a tile 102 from ASIC 100 shown in FIG. 1. Four controllable bus lines 1010a, 1010b, 1010c, and 1010d are depicted in FIG. 10, each of which is configured to direct data along a different direction (e.g., an east-flowing direction, a west-flowing direction, a north-flowing direction, and a south-flowing direction, in accordance with compass 300), as explained herein with respect to FIGS. 2-9B. Although only four controllable bus lines are shown in FIG. 10, additional controllable bus lines can be added as needed. For example, the tile 102 can include multiple north-flowing bus lines, multiple south-flowing bus lines, multiple east-flowing bus lines, and/or multiple west-flowing bus lines. In some implementations, the bus lines extend into and across multiple tiles.

The tile 102 shown in FIG. 10 further includes local memory 1002 that is proximate to cells 1006 from a computational array within the tile 102. For ease of viewing, only a single cell 1006 is shown in FIG. 10, though more cells 1006 are included within the tile 102 (e.g., in a computational array, such as array 204 shown in FIG. 2). The local memory 1002 is coupled to one or more cells 1006 of the computational array.

The controllable bus lines 1010a-1010d can include, e.g., general purpose controllable bus lines that carry data among the tiles 102 of the ASIC 100, the vector processing unit (e.g., vector processing unit 104), and the communications interface (e.g., communications interface 108). The data carried by the general purpose controllable bus lines can included, e.g., weight input data, activation input data, and/or programs (e.g., control instructions for operating the controllable bus lines).

The controllable bus lines 1010a-1010d in tile 102 shown in FIG. 10 are coupled to a multiplexer circuit 1020. The multiplexer 1020 allows data to be selected from one of the multiple controllable bus lines 1010a-1010d and then transferred to the local memory 1002. The particular controllable bus line 1010a-1010d from which data is transferred to the local memory 1002 is determined by an input select signal received at an input select port 1022 of the multiplexer 1020. For instance, if an input select signal received at input select port 1022 is "00," the multiplexer 1020 can output data from the east-flowing controllable bus line 1010a at the multiplexer output port 1024. Alternatively, in another example, if the input select signal received at the input select port 1022 is "11," the multiplexer 1020 can output data from the south-flowing controllable bus line 1010d. The input select signal can be stored locally at the tile 102 in a multiplexer input select register 1026. The input select control signal can be transferred to the input select register 1026 from a control tile of the ASIC 100, e.g., from a local memory of a control tile of the ASIC 100.

The output of the multiplexer 1020 is provided to the local memory 1002 of the tile 102 shown in FIG. 10. The output can include, e.g., weight input data. The weight input data can be stored in local memory 1002 and transferred to one or more cells 1006 of the computational array of the tile 102 at a later time.

As explained herein, data can be conveyed along the controllable bus lines in accordance with a clock cycle. In particular, each controllable bus line can include a conveyer element 1030 configured to pass data along the bus line. The conveyer element 1030 can include, e.g., a circuit configured to receive data from a portion of the bus line, store the received data, and re-transmit the stored data along the bus line, e.g., in accordance with a clock signal received at the conveyer element 1030.

The conveyer elements 1030 can include circuits, such as flip-flops, that are used to convey data along the lines in accordance with a clock signal. Transferring data over a controllable bus line can include shifting, at each clock cycle, data from a first conveyer element of the controllable bus line to a second adjacent conveyer element of the controllable bus line. In some implementations, data is conveyed over the controllable bus lines upon the rising or falling edge of a clock cycle. For example, data present, at a first clock cycle, on a first conveyer element (e.g., a flip-flop) of a controllable bus line can be transferred to a second conveyer element (e.g., a flip-flop) of the controllable bus line at a second clock cycle.

An advantage of including at least one conveyer element 1030 on a bus line is that the conveyer element 1030 allows the distance that data travels along the bus line to be increased. For instance, for a wire bus line without any conveyer elements 1030, the maximum distance that data can travel along the bus line within one clock cycle is limited by the drift speed of the electrons within the wire. Since this maximum distance may be less than the entire length or width of an ASIC 100, it is not possible to use the wire, alone, for transmitting data across the full span of the ASIC 100 within a single clock cycle. However, by including one or more conveyer elements 1030 on the bus line, the data then can be conveyed across bus line from one conveyer element to the next at each clock cycle.

As shown in the example, each controllable bus line 1010a-1010d within the tile 1020 includes a corresponding conveyer element 1030. Though only a single conveyer element 1030 per bus line is shown in FIG. 10, each controllable bus line can include multiple conveyer elements 1030. For example, the conveyer elements 1030 can be periodically spaced apart at fixed distances from one another across the entire length of a controllable bus line within the ASIC 100. Accordingly, in some implementations, a conveyer element 1030 may not be located at each tile 102 of the ASIC 100. Rather, for example, the conveyer elements 1030 on a particular controllable bus line can be separated from one another by a distance equivalent to two, three, four or more tiles of the ASIC 100.

Figure 11:
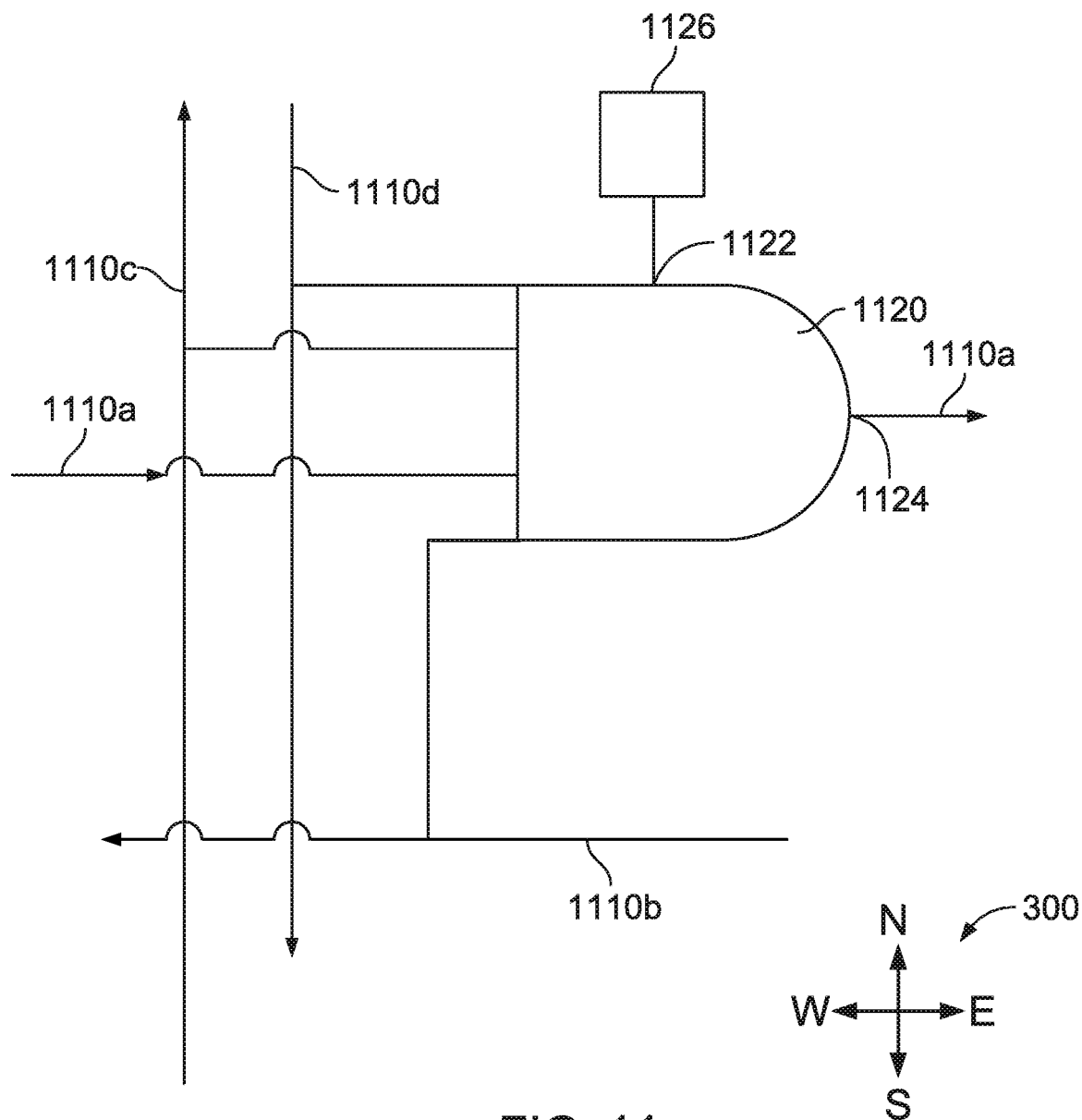
FIG. 11 is a schematic that illustrates an example of controllable bus lines within a tile.

In some implementations, multiplexers can be used to transfer data from one controllable bus line to another different controllable bus line. FIG. 11 is a schematic that illustrates an example of controllable bus lines within a tile 102, such as a tile 102 from ASIC 100 shown in FIG. 1. Again, four controllable bus lines 1110a, 1110b, 1110c, and 1110d are depicted in FIG. 11, each of which is configured to direct data along a different direction (e.g., an east-flowing direction, a west-flowing direction, a north-flowing direction, and a south-flowing direction, in accordance with compass 300), as explained herein with respect to FIGS. 2-9B. Although only four controllable bus lines are shown in FIG. 11, additional controllable bus lines can be added as needed. For example, the tile 102 can include multiple north-flowing bus lines, multiple south-flowing bus lines, multiple east-flowing bus lines, and/or multiple west-flowing bus lines. Additionally, though only a portion of the bus lines are depicted in FIG. 11 for ease of viewing, the bus lines can extend over the entire width or length of the tile, e.g., the bus lines can extend across multiple tiles. Additionally, the local memory, computational array and other multiplexers are not shown in FIG. 11 for ease of viewing.

The controllable bus lines 1110a-1110d can include, e.g., general purpose controllable bus lines that carry data among the tiles 102 of the ASIC 100, the vector processing unit (e.g., vector processing unit 104), and the communications interface (e.g., communications interface 108). The data carried by the general purpose controllable bus lines can included, e.g., weight input data.

In the example of FIG. 11, multiplexer 1120 is coupled to the controllable bus lines 1110a-1110d to allow a transfer of data from one of controllable bus lines 1110b-1110d to line 1110a. In particular, each input of the multiplexer 1120 is coupled to a different controllable bus line (e.g., the four inputs are coupled to bus line 1110a, 1110b, 1110c, and 1110d, respectively). With the configuration of the bus lines and multiplexer 1120 shown in FIG. 11, it is possible to transfer data from one of controllable bus lines 1110b-1110d to controllable bus line 1110a or to maintain, without alteration, the data that is on line 1110a.

The particular controllable bus line 1110b-1110d from which data is transferred to the line 1110a is determined by an input select signal received at an input select port 1122 of the multiplexer 1120. For instance, if an input select signal received at input select port 1122 is "00," the multiplexer 1120 can transfer data from the south-flowing controllable bus line 1110d onto line 1110a at the multiplexer output port 1124. Alternatively, in another example, if the input select signal received at the input select port 1122 is "01," the multiplexer 1120 can transfer data from the north-flowing controllable bus line 1110c onto line 1110a at the multiplexer output port 1124. Alternatively, in another example, if the input select signal received at the input select port 1122 is "11," the multiplexer 1120 can maintain data from the east-flowing controllable bus line 1110a at the input port of the multiplexer 1120 on the line 1110a at the multiplexer output port 1124.

The input select signal can be stored locally at the tile 102 in a multiplexer input select register 1126. The input select control signal can be transferred to the input select register 1126 from a control tile of the ASIC 100, e.g., from a local memory of a control tile of the ASIC 100.

In some implementations, the controllable bus lines are coupled to a demultiplexer within the tile 102. For example, in some implementations, data may need to be offloaded from the local memory onto one of the controllable bus lines. In such case, the local memory is coupled to an input port of the demultiplexer, which, in turn, has separate output ports, each of which is coupled to a different corresponding controllable bus line (e.g., a different corresponding general purpose controllable bus line, such as lines 1010a-1010d in FIG. 10 or lines 1110a-1110d in FIG. 11).

The particular controllable bus line to which data is transferred by the demultiplexer is determined by an input select signal received at an input select port of the demultiplexer. The input select signal for the demultiplexer can be stored locally at the tile 102 in a demultiplexer input select register coupled to the demultiplexer. The input select control signal can be transferred to the input select register coupled to the demultiplexer from a control tile of the ASIC 100, e.g., from a local memory of a control tile of the ASIC 100.

The example process described with respect to FIGS. 3A-9B may require that the activation values and weight inputs being fully propagated throughout the computational arrays of each tile before the cell computations are performed, or the cells may perform computations before all values are fully propagated. Furthermore, although the ASIC 100 has been described with weight inputs being sent to columns of a computational array and activation inputs being sent to rows of the computational array, in some implementations, the weight inputs are sent to rows of the array and the activation inputs are sent to columns of the array.

Furthermore, although the computational arrays have been described herein as using individual summation circuits within each cell, groups of cells within the computational array (e.g., all the cells within a column) may be coupled directly to a single summation circuit, which sums the received outputs from the cells in the group, thus reducing the number of summation circuits required to store the outputs.

Embodiments of the subject matter and the functional operations described in this specification can be implemented in digital electronic circuitry, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC. The apparatus can also include, in addition to hardware, code that creates an execution environment for the computer program in question, e.g., code that constitutes processor firmware, a protocol stack, a database management system, an operating system, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA, an ASIC, or a GPGPU (general purpose graphics processing unit).

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, although bus lines are described as "controllable," not all bus lines need to have the same level of control. For instance, there can be varying degrees of controllability, where some bus lines can be controlled only where some bus lines are restricted in terms of the number of tiles from which they can source data or to which they can send data. In an another example, some bus lines may be dedicated to providing data along a single direction, such as north, east, west, or south as described herein. In some cases, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A tile comprising circuitry for use with machine learning models, the tile comprising:

a first computational array of cells, wherein the first
   computational array of cells is a sub-array of a larger
   second computational array of cells;
local memory coupled to the first computational array of
   cells;
a multiplexer;
a plurality of controllable bus lines,
wherein a first subset of the plurality of controllable bus
   lines comprises a plurality of general purpose control-
   lable bus lines couplable to the local memory,
wherein at least two of the general purpose controllable
   bus lines are coupled to an input of the multiplexer,
wherein a second subset of the plurality of controllable
   bus lines comprises a plurality of partial sum control-
   lable bus lines,
wherein the plurality of partial sum controllable bus lines
   are couplable to the first computational array of cells,
wherein the plurality of partial sum controllable bus lines
   are coupled to another tile of the larger second com-
   putational array of cells, and are configured to receive
   a partial sum from, or transfer a partial sum to, the other
   tile of the larger second computational array of cells.

2. The tile of claim 1, wherein the plurality of general
purpose controllable bus lines comprises:
   a first group of general purpose controllable bus lines
      extending along a first dimension of the tile;
   a second group of general purpose controllable bus lines
      extending along a second dimension of the tile that is
      different from the first dimension.

3. The tile of claim 2, wherein the first group of general
purpose controllable bus lines comprises:
   at least one general purpose controllable bus line config-
      ured to transfer data in a first direction along the first
      dimension; and
   at least one general purpose controllable bus line config-
      ured to transfer data in a second opposite direction
      along the first dimension.

4. The tile of claim 3, wherein the second group of general
purpose controllable bus lines comprises:
   at least one general purpose controllable bus line config-
      ured to transfer data in a first direction along the second
      dimension; and
   at least one general purpose controllable bus line config-
      ured to transfer data in a second opposite direction
      along the second dimension.

5. The tile of claim 1,
wherein an output of the multiplexer is coupled to the
   local memory, and.

6. The tile of claim 5, wherein the tile comprises a register
coupled to an input select line of the multiplexer.

7. The tile of claim 1, wherein each general purpose
controllable bus line comprises a conveyer element.

8. The tile of claim 7, wherein the conveyer element is a
flip-flop.

9. The tile of claim 1, wherein each partial sum control-
lable bus line of the plurality of partial sum controllable bus
lines is further coupled to a vector processing unit.

10. The tile of claim 1, wherein the second computational
array of cells is a systolic array.

11. The tile of claim 1, wherein the local memory is
configured to receive weight input data, activation input
data, and/or instructions from a circuit element external to
the tile.

12. The tile of claim 11, wherein the circuit element
external to the tile is a communication interface of an
application specific integrated circuit.

13. The tile of claim 12, wherein the first subset of the
plurality of controllable bus lines is also coupled to the
circuit element external to the tile such that, during operation
of the tile, the weight input data, the activation input data,
and/or the instructions are passed along the first subset of the
plurality of controllable bus lines to the local memory.

14. The tile of claim 1, wherein the first subset of the
plurality of controllable bus lines is wired directly to a
second tile that encompasses an additional sub-array of the
larger second computational array of cells.

15. The tile of claim 14, wherein the first subset of the
plurality of controllable bus lines skip over a third tile that
encompasses yet another sub-array of the larger second
computational array of cells.

16. A tile comprising circuitry for use with machine
learning models, the tile comprising:
   a first computational array of cells, wherein the first
      computational array of cells is a sub-array of a larger
      second computational array of cells;
   local memory coupled to the first computational array of
      cells;
   a multiplexer;
   a plurality of controllable bus lines,
   wherein a first subset of the plurality of controllable bus
      lines comprises a plurality of general purpose control-
      lable bus lines couplable to the local memory,
   wherein at least two of the general purpose controllable
      bus lines are coupled to an input of the multiplexer,
   wherein a second subset of the plurality of controllable
      bus lines consists of a single partial sum controllable
      bus line,
   wherein the single partial sum controllable bus line is
      configured to receive a sum obtained by the first
      computational array of cells.

17. A method of operating an application specific inte-
grated circuit (ASIC) chip comprising a first tile, the first tile
comprising (1) a first computational array of cells that is a
sub-array of a larger second computational array of cells, (2)
local memory coupled to the first computational array of
cells, and (3) a plurality of controllable bus lines, the method
comprising:
   loading, from a first subset of the plurality of controllable
      bus lines, a plurality of weight inputs into the local
      memory of the first tile, wherein loading the plurality of
      weight inputs into the local memory of the first tile
      comprises receiving an input select signal at a multi-
      plexer that is coupled to the first subset of the plurality
      of controllable bus lines;
   transferring a first group of the plurality of weight inputs
      to cells of the first computational array from the local
      memory;
   receiving a plurality of activation inputs at cells of the first
      computational array of cells; and
   performing a computation with the first computational
      array of cells, using the first group of the plurality of
      weight inputs and the plurality of activation inputs, to
      provide a plurality of outputs.

18. The method of claim 17, wherein the multiplexer is
coupled to an additional subset of controllable bus lines, and
to the local memory.

19. The method of claim 17, wherein receiving the input
select signal at the multiplexer comprises receiving the input
select signal from a register coupled to the multiplexer.

20. The method of claim 19, comprising:
   receiving the input select signal from a second tile of the
      ASIC; and storing the input select signal in the register prior to passing the input select signal to the multiplexer.

21. The method of claim 17, wherein the plurality of activation inputs are received from the local memory.

22. The method of claim 21, comprising:
prior to the plurality of activation inputs being received at the cells of the first computational array of cells, receiving the plurality of activation inputs from the first subset of the controllable bus lines; and
loading the plurality of activation inputs from the first subset of the controllable bus lines in the local memory.

23. The method of claim 17, comprising:
receiving instructions from the first subset of the controllable bus lines; and
loading the instructions from the first subset of the controllable bus lines in the local memory.

24. The method of claim 17, comprising:
receiving, at the tile, the plurality of weight inputs, the plurality of activation inputs, and/or instructions, via the first subset of the plurality of controllable bus lines, from a communication interface of the ASIC.

25. The method of claim 17, comprising:
receiving, at the first tile, instructions, via the first subset of the plurality of controllable bus lines, from a second tile encompasses an additional sub-array of the larger second computational array of cells.

26. The method of claim 17, comprising:
receiving, at the tile, from a second subset of the plurality of controllable bus lines, a first partial sum;
adding, from the first computational array of cells, a computational output to the first partial sum to obtain a second partial sum;
outputting the second partial sum to the second subset of the plurality of controllable bus lines.

27. The method of claim 26, comprising passing the second partial sum from the second subset of the plurality of controllable bus lines to a vector processing unit.

28. The method of claim 26, wherein the second subset of the plurality of controllable bus lines extend to a second tile that encompasses an additional sub-array of the larger second computational array of cells.

* * * * *